(12) United States Patent
Okada

(10) Patent No.: US 9,275,949 B2
(45) Date of Patent: Mar. 1, 2016

(54) SEMICONDUCTOR DEVICE

(75) Inventor: Yuya Okada, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/116,791

(22) PCT Filed: May 29, 2012

(86) PCT No.: PCT/JP2012/064348
§ 371 (c)(1),
(2), (4) Date: Nov. 11, 2013

(87) PCT Pub. No.: WO2012/165647
PCT Pub. Date: Dec. 6, 2012

(65) Prior Publication Data
US 2014/0070411 A1    Mar. 13, 2014

(30) Foreign Application Priority Data

Jun. 1, 2011    (JP) ................................. 2011-123178
Jun. 1, 2011    (JP) ................................. 2011-123179

(51) Int. Cl.
*H01L 21/50*    (2006.01)
*H01L 23/10*    (2006.01)
*H01L 23/52*    (2006.01)
*H01L 23/00*    (2006.01)
(Continued)

(52) U.S. Cl.
CPC ............... *H01L 23/52* (2013.01); *H01L 21/50* (2013.01); *H01L 23/10* (2013.01); *H01L 23/49811* (2013.01); *H01L 23/564* (2013.01); *H01L 27/14618* (2013.01); *H01L 31/0203* (2013.01); *H01L 2224/48091* (2013.01); *H01L 2924/09701* (2013.01)

(58) Field of Classification Search
CPC ....... H01L 21/50; H01L 23/10; H01L 23/564; H01L 27/14618; H01L 31/0203; H01L 23/49811; H01L 23/52; H01L 31/02366; H01L 31/186; H01L 23/373; H01L 29/7847
See application file for complete search history.

(56) References Cited

U.S. PATENT DOCUMENTS

| | | | |
|---|---|---|---|
| 4,399,707 A * | 8/1983 | Wamstad | 73/727 |
| 6,232,652 B1 | 5/2001 | Matsushima | 257/667 |

(Continued)

FOREIGN PATENT DOCUMENTS

| | | |
|---|---|---|
| EP | 1596438 | 11/2005 |
| EP | 1633002 | 3/2006 |

(Continued)

*Primary Examiner* — Jarrett Stark
*Assistant Examiner* — Bitew Dinke
(74) *Attorney, Agent, or Firm* — Fitzpatrick, Cella, Harper & Scinto

(57) ABSTRACT

Provided is a semiconductor device in which a semiconductor element mounted on a wiring substrate is placed in a hollow portion, the hollow portion being formed by the wiring substrate, a protective member, and a wall member, with the wiring substrate, the protective member, and the wall member being a bottom surface, a top surface, and side surfaces thereof, respectively. The wall member has a vent hole provided therein, which communicates the hollow portion to/from the outside, and the vent hole includes a pillar member formed of a material having a linear expansion coefficient which is smaller than that of the wall member. Therefore, airtightness of the hollow portion is maintained to prevent entry of foreign matters at ordinary temperature, and vapor pressure in the hollow portion is relieved when heated.

3 Claims, 9 Drawing Sheets

(51) Int. Cl.
*H01L 27/146* (2006.01)
*H01L 31/0203* (2014.01)
*H01L 23/498* (2006.01)

(56) References Cited

U.S. PATENT DOCUMENTS

| | | | | |
|---|---|---|---|---|
| 6,426,591 | B1 * | 7/2002 | Yanagisawa et al. | 313/512 |
| 6,428,650 | B1 * | 8/2002 | Chung | 156/250 |
| 6,759,266 | B1 * | 7/2004 | Hoffman | 438/64 |
| 7,247,509 | B2 * | 7/2007 | Yamauchi et al. | 438/33 |
| 2006/0267168 | A1 * | 11/2006 | Misawa et al. | 257/678 |
| 2007/0194439 | A1 * | 8/2007 | Kawabata | 257/704 |
| 2007/0246812 | A1 * | 10/2007 | Zhuang | 257/678 |
| 2007/0247534 | A1 * | 10/2007 | Murata et al. | 348/294 |
| 2008/0001240 | A1 * | 1/2008 | Minamio et al. | 257/434 |
| 2008/0185712 | A1 | 8/2008 | Kanayama et al. | 257/712 |
| 2009/0038843 | A1 * | 2/2009 | Yoneda et al. | 174/521 |
| 2009/0046183 | A1 | 2/2009 | Nishida et al. | 348/294 |
| 2009/0140405 | A1 * | 6/2009 | Maruo et al. | 257/680 |
| 2009/0231477 | A1 * | 9/2009 | Igarashi et al. | 348/294 |
| 2009/0294887 | A1 * | 12/2009 | Hirano et al. | 257/434 |
| 2010/0104887 | A1 * | 4/2010 | Yamamoto et al. | 428/576 |
| 2010/0149410 | A1 * | 6/2010 | Matsuzawa | 348/374 |
| 2012/0306354 | A1 * | 12/2012 | Seibel et al. | 313/503 |
| 2013/0094163 | A1 * | 4/2013 | Hayashi | H01L 23/055 361/757 |
| 2013/0264722 | A1 | 10/2013 | Okada | 257/777 |
| 2014/0008753 | A1 * | 1/2014 | Tsuduki et al. | 257/433 |

FOREIGN PATENT DOCUMENTS

| | | | | |
|---|---|---|---|---|
| JP | 2002124589 A | * | 4/2002 | H01L 23/02 |
| JP | 2004-119881 | | 4/2004 | |
| JP | 2004119881 A | * | 4/2004 | H01L 23/02 |
| JP | 2006-303481 | | 11/2006 | |

* cited by examiner

SEMICONDUCTOR DEVICE

TECHNICAL FIELD

The present invention relates to a semiconductor device having a hollow structure.

BACKGROUND ART

An image sensor package using a CCD image sensor or a CMOS image sensor used in a digital camera or a video camera, and a SAW filter package used in a cellular phone or the like are semiconductor devices having a hollow structure. A semiconductor device having a hollow structure has a structure in which, after a semiconductor element is mounted on a wiring substrate and electrodes of the semiconductor element and electrodes of the wiring substrate are electrically connected to each other through use of metal wires, a protective member is attached from above the wiring substrate so as to encapsulate the semiconductor element in a hollow portion.

A semiconductor device having a hollow structure has a problem in that moisture which enters the hollow portion due to moisture absorption by an adhesive made from a resin or by a resin material of a wiring substrate or the like expands by reflow heating when the semiconductor device is mounted on a motherboard, and the vapor pressure of the moisture separates the protective member.

To cope with this problem, in PTL 1, a vent hole is provided between the protective member and a frame. Water vapor in the hollow portion, which has expanded by heating in the mounting, is released from the vent hole to the outside so that vapor pressure caused in the hollow portion is reduced to prevent separation of the protective member.

However, in the method described in PTL 1, the vent hole is always open even when the semiconductor device is not heated, and thus, there is a problem in that the hollow portion is not airtight and foreign matters enter the hollow portion.

Entry of foreign matters into the hollow portion has been a cause of a short circuit between electrically connected terminals. Further, in a semiconductor device which uses an optical element as a semiconductor element, adhesion of foreign matters to a light receiving portion or a light emitting portion of the optical element has been a cause of unsatisfactory optical characteristics.

CITATION LIST

Patent Literature

PTL 1: Japanese Patent Application Laid-Open No. 2004-119881

SUMMARY OF INVENTION

Accordingly, an object of the present invention is to provide a semiconductor device which maintains airtightness of a hollow portion to prevent entry of foreign matters thereinto at ordinary temperature and which may relieve vapor pressure in the hollow portion when heated.

A semiconductor device according to an exemplary embodiment of the present invention includes: a wiring substrate; a protective member spaced from the wiring substrate; a semiconductor element placed between the wiring substrate and the protective member and electrically connected to the wiring substrate; and a wall member which is placed between the wiring substrate and the protective member so as to surround the semiconductor element and which thermally expands in a height direction when heated. One end of the wall member in the height direction is fixed to one of the wiring substrate and the protective member, and the other end of the wall member in the height direction is fixed to the other of the wiring substrate and the protective member. A vent hole extending between the wiring substrate and the protective member is formed in the wall member, and a pillar member formed of a material having a linear expansion coefficient which is smaller than that of the wall member is provided in the vent hole. In order that one end of the pillar member in the height direction is in contact with one of the wiring substrate and the protective member at ordinary temperature, the other end of the pillar member in the height direction is fixed to the other of the wiring substrate and the protective member.

Further, a semiconductor device according to another exemplary embodiment of the present invention includes: a wiring substrate; a protective member spaced from the wiring substrate; a semiconductor element placed between the wiring substrate and the protective member and electrically connected to the wiring substrate; a first wall member which is placed between the wiring substrate and the protective member so as to surround the semiconductor element and which thermally expands in a height direction when heated; and a second wall member which is placed between the wiring substrate and the protective member so as to surround the first wall member and which thermally expands in the height direction when heated. One end of one of the first wall member and the second wall member in the height direction is fixed to one of the wiring substrate and the protective member, and the other end of the one wall member in the height direction is fixed to the other of the wiring substrate and the protective member. In order that one end of the other of the first wall member and the second wall member in the height direction is in contact with one of the wiring substrate and the protective member at ordinary temperature, the other end of the other wall member in the height direction is fixed to the other of the wiring substrate and the protective member. The one wall member includes a breathable porous layer. The other wall member is formed of a material having a linear expansion coefficient which is smaller than that of the one wall member.

According to the present invention, the hollow portion is formed by being surrounded by the wiring substrate, the protective member, and the wall member. At ordinary temperature, the pillar member may maintain the airtightness of the hollow portion to prevent entry of foreign matters thereinto. When heated, water vapor in the hollow portion may be relieved to the outside through the vent hole at a place corresponding to the pillar member, thereby suppressing pressure rise in the hollow portion and preventing separation of the protective member.

Further features of the present invention will become apparent from the following description of exemplary embodiments with reference to the attached drawings.

DESCRIPTION OF EMBODIMENTS

Embodiments for carrying out the present invention are described in detail in the following with reference to the drawings.

First Embodiment

Figure 1A:
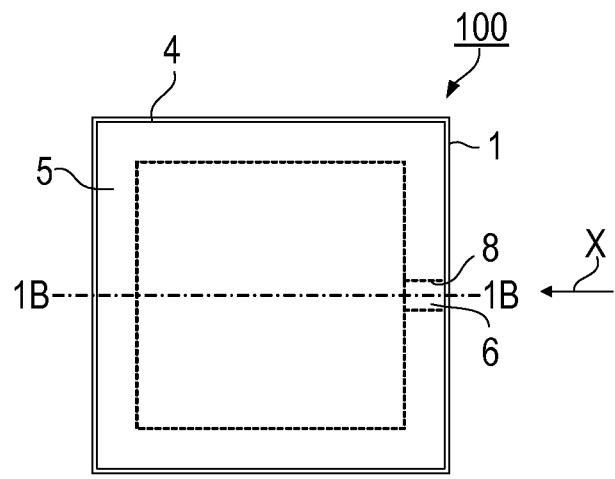
FIGS. 1A, 1B, 1C, and 1D are explanatory views illustrating a schematic structure of a semiconductor device according to a first embodiment of the present invention.
Figure 1B:
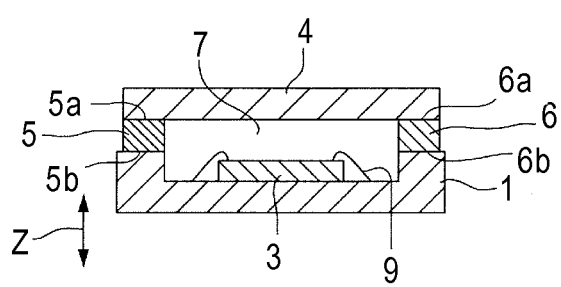
Figure 1C:
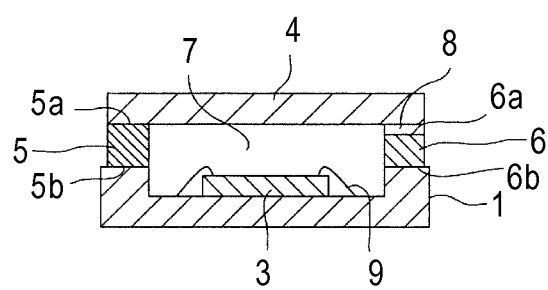
Figure 1D:
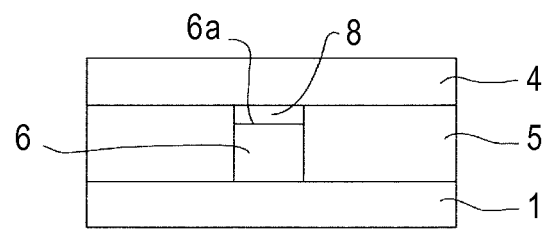

FIGS. 1A to 1D are explanatory views illustrating a schematic structure of a semiconductor device according to a first embodiment of the present invention. FIG. 1A is a plan view of the semiconductor device. FIG. 1B is a sectional view taken along the line 1B-1B of FIG. 1A of the semiconductor device in a state at ordinary temperature. FIG. 1C is a sectional view similar to FIG. 1B of the semiconductor device in a heated state. FIG. 1D is a side view illustrating a principal part of the semiconductor device in the heated state seen from the direction of an arrow X of FIG. 1A.

As illustrated in FIGS. 1A to 1D, a semiconductor device 100 includes a wiring substrate 1, a protective member 4 spaced from the wiring substrate 1, and a semiconductor element 3 placed between the wiring substrate 1 and the protective member 4 and electrically connected to the wiring substrate 1. The semiconductor element 3 is face-up mounted on the wiring substrate 1, and is electrically connected to the wiring substrate 1 through metal wires 9.

Further, the semiconductor device 100 includes a wall member 5 which is placed between the wiring substrate 1 and the protective member 4 so as to surround the semiconductor element 3 and which thermally expands in a height direction (direction of an arrow Z of FIG. 1B) when heated. The wall member 5 is formed in the shape of a frame. The wall member 5 is formed of a cured adhesive. More specifically, the wall member 5 is formed of a material which bonds the wiring substrate 1 and the protective member 4 together.

More specifically, one end 5a of the wall member 5 in the height direction is bonded and fixed to one of the wiring substrate 1 and the protective member 4 (in FIGS. 1A to 1D, the protective member 4). Further, the other end 5b of the wall member 5 in the height direction is bonded and fixed to the other of the wiring substrate 1 and the protective member 4 (in FIGS. 1A to 1D, the wiring substrate 1).

In the semiconductor device 100, a hollow portion 7 is formed with the wiring substrate 1, the protective member 4, and the wall member 5 being a bottom surface, a top surface, and side surfaces thereof, respectively. In other words, the semiconductor element 3 is placed in the hollow portion 7. A rectangular vent hole 8 extending in the height direction between the wiring substrate 1 and the protective member 4 is formed in the wall member 5. The vent hole 8 is a through hole which communicates the hollow portion 7 to/from the outside. To the vent hole 8, a pillar member 6 formed of a material having a linear expansion coefficient which is smaller than that of the wall member 5 is provided. The pillar member 6 is formed in the same shape (rectangular) as that of the vent hole 8 so as to close the vent hole 8 at ordinary temperature. Ordinary temperature as used herein refers to temperature around room temperature (for example, 25° C.).

In order that one end 6a of the pillar member 6 in the height direction is in contact with one of the wiring substrate 1 and the protective member 4 (in FIGS. 1A to 1D, the protective member 4) at ordinary temperature, the other end 6b of the pillar member 6 in the height direction is fixed to the other of the wiring substrate 1 and the protective member 4 (in FIGS. 1A to 1D, the wiring substrate 1). In other words, the one end 6a of the pillar member 6 and the protective member 4 are not in a state of being bonded together. Note that, the pillar member 6 and the wall member 5 are not in a state of being bonded together, either.

It is preferred that a material for forming the wall member 5 of the first embodiment contain a resin material having a large linear expansion coefficient such as a thermosetting resin or a photocurable resin. For example, the linear expansion coefficient of a thermosetting epoxy resin containing about 50% of a silica filler is about 1.0 to $2.0 \times 10^{-4}$/K, and the linear expansion coefficient of a photocurable epoxy resin containing about 16% of a silica filler is about 1.5 to $2.5 \times 10^{-4}$/K. The linear expansion coefficient of a thermosetting semiconductor resin containing no filler is about 2.0 to $3.0 \times 10^{-4}$/K.

It is desired that the width of the wall member 5 be set depending on the volume of the hollow portion 7 in which vapor pressure is caused. For example, when the volume of the hollow portion 7 is about 40 mm³, about 60 mm³, and about 80 mm³, the width of the wall member 5 is about 0.8 mm, 1.0 mm, and 1.3 mm, respectively.

It is preferred that a material for forming the pillar member 6 of the first embodiment be, for example, an inorganic material having a small linear expansion coefficient such as a metal or a ceramic. For example, with regard to metals, Au has a linear expansion coefficient of about $0.14 \times 10^{-4}$/K, and Cu has a linear expansion coefficient of about $0.17 \times 10^{-4}$/K. Alumina, which is a ceramic, has a linear expansion coefficient of about 0.07 to $0.08 \times 10^{-4}$/K.

As the wiring substrate 1 of the first embodiment, a hard substrate such as a glass epoxy based substrate, a ceramic based substrate, or an aluminum insulating substrate, a flexible substrate such as an FPC or a TAB, a light-permeable substrate such as a glass substrate, or the like may be used. As the protective member 4 of the first embodiment, for example, a metal plate, a ceramic plate, or a glass plate may be used. Further, the protective member 4 may include a wiring layer.

Further, with regard to the method of forming the pillar member 6, a layer of a base material of the wiring substrate 1 may be used or multiple layers of the base material may be stacked. Alternatively, the pillar member 6 may be formed simultaneously with formation of metal wiring of the wiring substrate 1 by the same manufacturing method as that of the metal wiring, or the pillar member 6 may be formed by machining or etching when the wiring substrate 1 is formed. In this case, the pillar member 6 may be formed simultaneously when the wiring substrate 1 is formed, and thus, an extra step of placing the pillar member 6 is unnecessary. Further, with regard to the method of forming the pillar member 6, the pillar member 6 may be bonded with use of an adhesive after the wiring substrate 1 is formed. On that occasion, it is preferred to carry out the bonding with use of the same material as that of the wall member 5. In this case, bonding of the protective member 4 to the wiring substrate 1 and bonding of the pillar member 6 to the wiring substrate 1 may be simultaneously carried out, and thus, an extra step of bonding the pillar member 6 to the wiring substrate 1 is unnecessary.

Next, action of the semiconductor device 100 is described. As illustrated in FIGS. 1C and 1D, when the pillar member 6 is not in a state of being bonded to the protective member 4, the wall member 5 expands by heating and pushes up the protective member 4. Further, the wall member 5 which expands by heating becomes larger than the pillar member 6 due to the difference in linear expansion coefficient. Therefore, the vent hole 8 opens between the one end 6a of the pillar member 6 and the protective member 4. Vapor pressure caused in the hollow portion 7 by heating may be thus relieved to the outside through the vent hole 8, and thus, separation and damage of the protective member 4 may be prevented.

For example, a thermosetting resin having a linear expansion coefficient of $1.80 \times 10^{-4}$/K is used as the wall member 5, alumina having a linear expansion coefficient of $0.07 \times 10^{-4}$/K is used as the pillar member 6, the thickness of the wall member 5 and the pillar member 6 at ordinary temperature of 25° C. is 150 μm, and the bonded width of the wall member 5 is 1 mm.

When the semiconductor device 100 is heated to 100° C. which is the boiling point of water, the vent hole 8 of about 1.9 μm opens between the protective member 4 and the one end 6a of the pillar member 6. In reflow mounting on a motherboard, when the reflow heating temperature is 220° C., the vent hole 8 of about 5 μm opens between the protective member 4 and the one end 6a of the pillar member 6. Therefore, gaseous water vapor may be sufficiently released from the hollow portion 7 through the vent hole 8 to the outside.

Further, under a state in which the semiconductor device 100 is heated to, for example, 60° C. due to heat generated when the semiconductor element 3 operates, the size of the vent hole 8 is about 0.9 μm. The bonded width of the wall member 5 is 1 mm while the size of the vent hole 8 is 0.9 μm, and thus, entry of foreign matters through the vent hole 8 may be prevented.

It is desired to select the materials of the wall member 5 and the pillar member 6 having such linear expansion coefficients that the entry of foreign matters into the hollow portion 7 is prevented in this way even when the vent hole 8 opens by heat generated when the semiconductor device 100 operates. For example, when the height of the wall member 5 and the pillar member 6 is 150 μm at ordinary temperature of 25° C. as in this embodiment, it is desired to use, as the wall member 5, a resin having a linear expansion coefficient which is adjusted by, for example, adding a silica filler so that the linear expansion coefficient difference from the pillar member 6 is $1.97 \times 10^{-4}$/K or less.

Alternatively, it is desired to adjust the height of the wall member 5 and the pillar member 6 so that the entry of foreign matters into the hollow portion 7 is prevented even when the vent hole 8 opens by heat generated when the semiconductor device 100 operates. For example, when a thermosetting resin having a linear expansion coefficient of $2.50 \times 10^{-4}$/K is used as the wall member 5 and alumina having a linear expansion coefficient of $0.07 \times 10^{-4}$/K is used as the pillar member 6, it is desired that the height of the wall member 5 and the pillar member 6 be 116 μm or less. When the height of the wall member 5 and the pillar member 6 is 110 μm, under a state in which the semiconductor device 100 is heated to 60° C. due to heat generated when the semiconductor element 3 operates, the size of the vent hole 8 is about 0.9 μm, and thus, the entry of foreign matters through the vent hole 8 may be prevented.

When the semiconductor device 100 is heated to 100° C. which is the boiling point of water, the vent hole 8 of about 2.0 μm is formed between the protective member 4 and the one end 6a of the pillar member 6. In reflow mounting on a motherboard, when the reflow heating temperature is 220° C., the vent hole 8 of about 5.2 μm is formed between the protective member 4 and the one end 6a of the pillar member 6. At ordinary temperature, the wall member 5 and the pillar member 6 return to their original sizes and return to the state illustrated in FIG. 1B, and thus, the vent hole 8 closes and the airtightness of the hollow portion 7 is maintained.

As described above, according to the first embodiment, the wall member 5 has a linear expansion coefficient which is larger than that of the pillar member 6, and thus, when heated, expands more and becomes larger than the pillar member 6. The pillar member 6 is not in a state of being bonded to the protective member 4, and thus, when the wall member 5 expands and pushes up the protective member 4 in the height direction, the vent hole 8 which communicates the hollow portion 7 to/from the outside opens between the one end 6a of the pillar member 6 and the protective member 4. Gas having a vapor pressure in the hollow portion 7, which is caused when the semiconductor device 100 is heated, may be relieved to the outside through the vent hole 8. On the other hand, at ordinary temperature, due to contraction of the wall member 5, the vent hole 8 closes and the airtightness of the hollow portion 7 is maintained. This may maintain the airtightness of the hollow portion 7 at ordinary temperature to prevent entry of foreign matters into the hollow portion 7 and may relieve gas having a vapor pressure in the hollow portion 7 when the semiconductor device 100 is heated.

Note that, in the first embodiment, in order that the one end 6a of the pillar member 6 is in contact with the protective member 4 at ordinary temperature, the other end 6b is fixed to the wiring substrate 1, but the present invention is not limited thereto. Alternatively, in order that the one end of the pillar member 6 is in contact with the wiring substrate 1 at ordinary temperature, the other end may be fixed to the protective member 4. In this case, an end of the wall member 5 on a side to be fixed to the wiring substrate 1 is the one end, and an end of the wall member 5 on a side to be fixed to the protective member 4 is the other end. In this case, also, the effect and action similar to those of the above-mentioned first embodiment are obtained.

Second Embodiment

Figure 2:
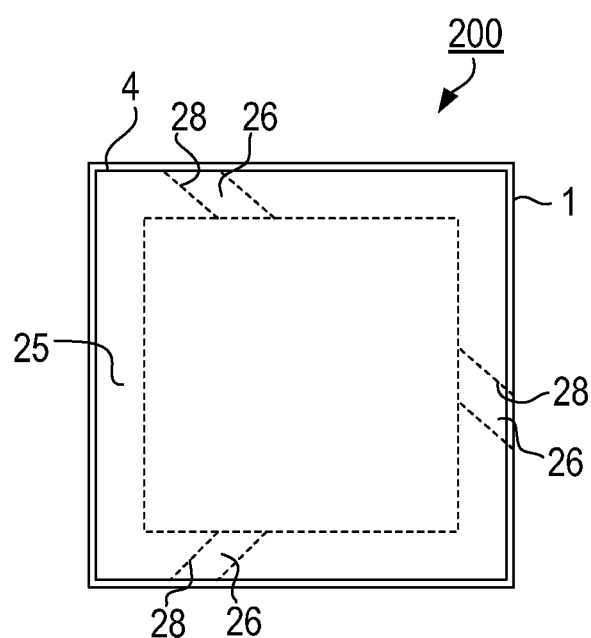
FIG. 2 is a plan view of a semiconductor device according to a second embodiment of the present invention.

Next, a semiconductor device according to a second embodiment of the present invention is described. FIG. 2 is a plan view of the semiconductor device according to the second embodiment of the present invention.

In the second embodiment, similarly to the case of the above-mentioned first embodiment, a semiconductor device 200 includes a wall member 25, but the wall member 25 has multiple vent holes 28 provided therein. Each of the vent holes 28 is provided with a pillar member 26. In this case, during the course of the manufacturing process, when a liquid adhesive to be the wall member 25 after being cured is injected, the distance between the protective member 4 and the wiring substrate 1 may be accurately controlled through use of the pillar members 26 as spacers.

This causes the height of the wall member 25 existing between the wiring substrate 1 and the protective member 4 to be the same at various points in a peripheral direction, and a tilt of the protective member 4 with respect to the wiring substrate 1 is suppressed. Therefore, even when the wall member 25 expands when heated, a height difference caused at various points in the peripheral direction of the wall member 25 may be suppressed, and, when the semiconductor device 200 is heated, the wall member 25 pushes up the protective member 4 so as to be in parallel with the wiring substrate 1. This sufficiently opens the vent holes 28 at the pillar members 26 to improve the breathability.

In this case, in order that the protective member 4 is supported in parallel with the wiring substrate 1, it is desired to provide three or more pillar members 26.

Further, the pillar members 26 may be diagonally placed as illustrated in FIG. 2. In this case, the horizontal length of the pillar member 26 which communicates the hollow portion to/from the outside becomes larger, and thus, the airtightness at ordinary temperature may be further enhanced.

Third Embodiment

Figure 3A:
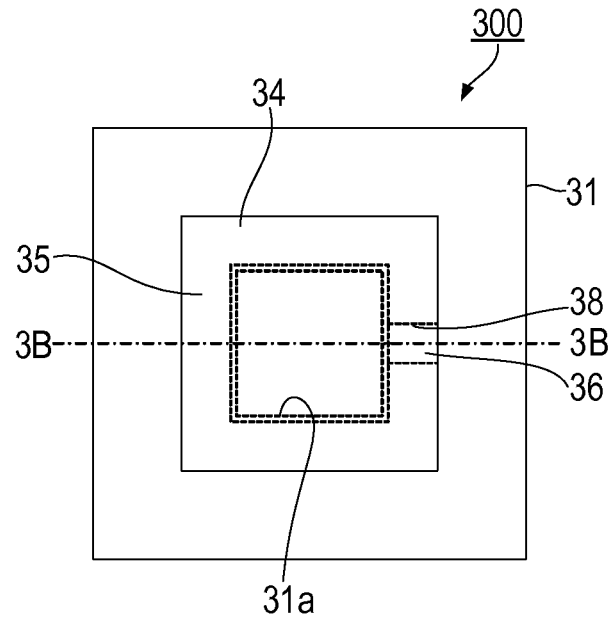
FIGS. 3A, 3B, and 3C are explanatory views illustrating a schematic structure of a semiconductor device according to a third embodiment of the present invention.
Figure 3B:
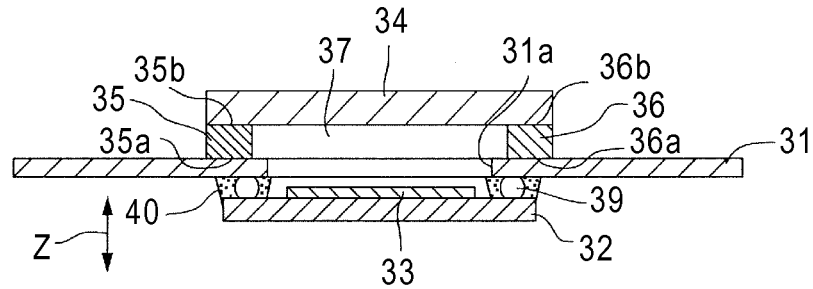
Figure 3C:
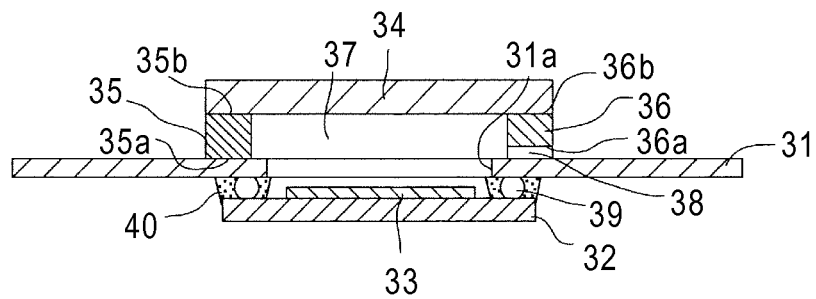

Next, a semiconductor device according to a third embodiment of the present invention is described. FIGS. 3A to 3C are explanatory views illustrating a schematic structure of the semiconductor device according to the third embodiment of the present invention. FIG. 3A is a plan view of the semiconductor device. FIG. 3B is a sectional view taken along the line 3B-3B of FIG. 3A of the semiconductor device in a state at ordinary temperature. FIG. 3C is a sectional view similar to FIG. 3B of the semiconductor device in a heated state.

As illustrated in FIGS. 3A to 3C, a semiconductor device 300 includes a wiring substrate 31 having an opening portion 31a formed therein and a protective member 34 spaced from the wiring substrate 31. Further, the semiconductor device 300 includes a semiconductor substrate 32 which is placed at a position opposed to the protective member 34 through the opening portion 31a of the wiring substrate 31 and which is electrically connected to the wiring substrate 31. Further, the semiconductor device 300 includes a semiconductor element 33 which is displaced on the semiconductor substrate 32 at a position corresponding to the opening portion 31a of the wiring substrate 31. In other words, the semiconductor substrate 32 is placed on a side opposite to the protective member 34 with respect to the wiring substrate 31, and the semiconductor element 33 is opposed to the protective member 34 through the opening portion 31a. The semiconductor element 33 and the semiconductor substrate 32 form a semiconductor chip.

The semiconductor element 33 is an optical element having a function of any one of a light receiving portion and a light emitting portion or both thereof. The protective member 34 has light permeability. The semiconductor element 33 is displaced on the semiconductor substrate 32. The semiconductor element 33 and the semiconductor substrate 32 form a semiconductor chip. The semiconductor substrate 32 is face-down mounted on the wiring substrate 31. The wiring substrate 31 and the semiconductor substrate 32 are electrically connected to each other through a bump 39 such as a solder ball. Further, the periphery of the bump 39 is sealed with an underfill resin 40, and hence the space between the wiring substrate 31 and the semiconductor substrate 32 is sealed.

Further, the semiconductor device 300 includes a wall member 35 which is placed between the wiring substrate 31 and the protective member 34 so as to surround the semiconductor element 33 and which thermally expands in the height direction (direction of the arrow Z) when heated. The wall member 35 is formed in the shape of a frame. The wall member 35 is formed of a cured adhesive. More specifically, the wall member 35 is formed of a material which bonds the wiring substrate 31 and the protective member 34 together.

One end 35a of the wall member 35 in the height direction is bonded and fixed to one of the wiring substrate 31 and the protective member 34 (in FIGS. 3A to 3C, the wiring substrate 31). Further, the other end 35b of the wall member 35 in the height direction is bonded and fixed to the other of the wiring substrate 31 and the protective member 34 (in FIGS. 3A to 3C, the protective member 34).

In the semiconductor device 300, a hollow portion 37 is formed with the semiconductor substrate 32 being a bottom surface, with the protective member 34 being a top surface, and with the wall member 35, side surfaces of the opening portion of the wiring substrate 31, and the resin 40 encapsulating the bump 39 being side surfaces thereof. In other words, the semiconductor element 33 is placed in the hollow portion 37. A rectangular vent hole 38 extending in the height direction between the wiring substrate 31 and the protective member 34 is formed in the wall member 35. The vent hole 38 is a through hole which communicates the hollow portion 37 to/from the outside. In the vent hole 38, a pillar member 36 formed of a material having a linear expansion coefficient which is smaller than that of the wall member 35 is provided. The pillar member 36 is formed in the same shape (rectangular) as that of the vent hole 38 so as to close the vent hole 38 at ordinary temperature. Ordinary temperature as used herein refers to temperature around room temperature (for example, 25° C.).

One end 36a of the pillar member 36 in the height direction is in contact with one of the wiring substrate 31 and the protective member 34 (in FIGS. 3A to 3C, the wiring substrate 31) at ordinary temperature. Further, the other end 36b of the pillar member 36 in the height direction is fixed to the other of the wiring substrate 31 and the protective member 34 (in FIGS. 3A to 3C, the protective member 34). In other words, the one end 36a of the pillar member 36 and the wiring substrate 31 are not in a state of being bonded together. Note that, the pillar member 36 and the wall member 35 are not in a state of being bonded together, either.

With regard to the method of forming the pillar member 36, the pillar member 36 may be formed by machining or etching when the protective member 34 is formed. In this case, the pillar member 36 may be formed simultaneously when the protective member 34 is formed, and thus, an extra step of placing the pillar member 36 is unnecessary. Further, with regard to the method of forming the pillar member 36, the pillar member 36 may be bonded with use of an adhesive after the protective member 34 is formed. On that occasion, it is preferred to carry out the bonding with use of the same material as that of the wall member 35. In this case, bonding of the protective member 34 to the wiring substrate 31 and bonding of the pillar member 36 to the wiring substrate 31 may be simultaneously carried out, and thus, an extra step of bonding the pillar member 36 to the wiring substrate 31 is unnecessary.

Next, action of the semiconductor device 300 is described. As illustrated in FIG. 3C, when the pillar member 36 is not in a state of being bonded to the wiring substrate 31, the wall member 35 expands by heating and pushes up the protective member 34. Further, the wall member 35 which expands by heating becomes larger than the pillar member 36 due to the difference in linear expansion coefficient. Therefore, the vent hole 38 opens between the one end 36a of the pillar member 36 and the wiring substrate 31. Vapor pressure caused in the hollow portion 37 by heating may be thus relieved to the outside through the vent hole 38, and thus, separation and damage of the protective member 34 and the semiconductor substrate 32 may be prevented. At ordinary temperature, the wall member 35 and the pillar member 36 return to their original sizes and return to the state illustrated in FIG. 3B, and thus, the vent hole 38 closes and the airtightness of the hollow portion 37 is maintained.

For example, an ultraviolet curable resin having a linear expansion coefficient of $2.0\times10^{-4}$/K is used as the wall member 35, copper having a linear expansion coefficient of $0.17\times10^{-4}$/K is used as the pillar member 36, the height of the wall member 35 and the pillar member 36 at ordinary temperature of 25° C. is 150 µm, and the bonded width of the wall member 35 is 500 µm.

When the semiconductor device 300 of the third embodiment is heated to 100° C. which is the boiling point of water, the vent hole 38 of about 2.1 µm opens between the wiring substrate 31 and the one end 36a of the pillar member 36. In reflow mounting on a motherboard, when the reflow heating temperature is 220° C., the vent hole 38 of about 5.4 µm opens between the wiring substrate 31 and the one end 36a of the pillar member 36. Further, under a state in which the semiconductor device 300 is heated to, for example, 60° C. due to heat generated when the semiconductor element 33 operates, the size of the vent hole 38 is about 0.96 µm while the bonded width of the wall member 35 is 500 µm, and thus, entry of foreign matters through the vent hole 38 into the hollow portion 37 may be prevented.

As described above, according to the third embodiment, the wall member 35 has a linear expansion coefficient which is larger than that of the pillar member 36, and thus, when heated, expands more and becomes larger than the pillar member 36. The pillar member 36 is not in a state of being bonded to the wiring substrate 31, and thus, when the wall member 35 expands and pushes up the protective member 34 in the height direction, the vent hole 38 which communicates the hollow portion 37 to/from the outside opens between the one end 36a of the pillar member 36 and the wiring substrate 31. Gas having a vapor pressure in the hollow portion 37, which is caused when heated, may be relieved to the outside through the vent hole 38. On the other hand, at ordinary temperature, due to contraction of the wall member 35, the vent hole 38 closes and the airtightness of the hollow portion 37 is maintained. This may maintain the airtightness of the hollow portion 37 at ordinary temperature to prevent entry of foreign matters into the hollow portion 37 and may relieve gas having a vapor pressure in the hollow portion 37 when the semiconductor device 300 is heated.

Note that, in the third embodiment, in order that the one end 36a of the pillar member 36 is in contact with the wiring substrate 31 at ordinary temperature, the other end 36b is fixed to the protective member 34, but the present invention is not limited thereto. Alternatively, in order that the one end of the pillar member 36 is in contact with the protective member 34 at ordinary temperature, the other end may be fixed to the wiring substrate 31. In this case, an end of the wall member 35 on a side to be fixed to the protective member 34 is the one end, and an end of the wall member 35 on a side to be fixed to the wiring substrate 31 is the other end. In this case, also, the effect and action similar to those of the above-mentioned third embodiment are obtained.

Fourth Embodiment

Figure 4:
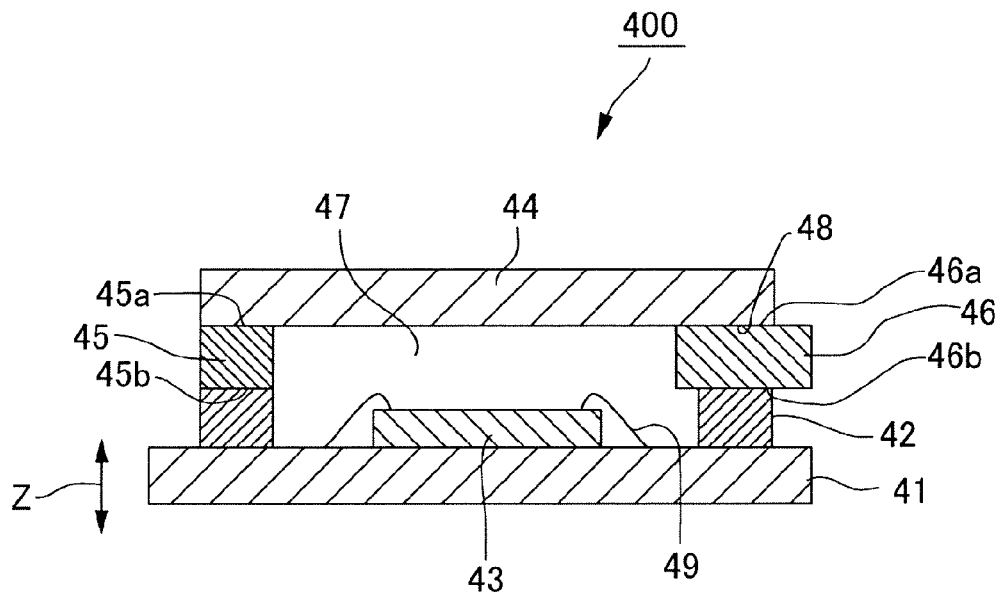
FIG. 4 is a sectional view illustrating a schematic structure of a semiconductor device according to a fourth embodiment of the present invention.

Next, a semiconductor device according to a fourth embodiment of the present invention is described. FIG. 4 is a sectional view of the semiconductor device according to the fourth embodiment of the present invention in a state at ordinary temperature.

As illustrated in FIG. 4, a semiconductor device 400 includes a wiring substrate 41, a protective member 44 spaced from the wiring substrate 41, and a semiconductor element 43 placed between the wiring substrate 41 and the protective member 44 and electrically connected to the wiring substrate 41. The semiconductor element 43 is face-up mounted on the wiring substrate 41, and is electrically connected to the wiring substrate 41 through metal wires 49.

Further, the semiconductor device 400 includes a frame 42 which is placed between the wiring substrate 41 and the protective member 44 so as to surround the semiconductor element 43 and which is fixed to the wiring substrate 41. Further, the semiconductor device 400 includes a wall member 45 which is placed between the frame 42 and the protective member 44 so as to surround the semiconductor element 43 and which thermally expands in the height direction (direction of the arrow Z) when heated. The wall member 45 is formed in the shape of a frame. The wall member 45 is formed of a cured adhesive. More specifically, the wall member 45 joins the protective member 44 and the wiring substrate 41 together through the frame 42 and is formed of a material which bonds the frame 42 and the protective member 44 together.

One end 45a of the wall member 45 in the height direction is bonded and fixed to one of the frame 42 and the protective member 44 (in FIG. 4, the protective member 44). Further, the other end 45b of the wall member 45 in the height direction is bonded and fixed to the other of the frame 42 and the protective member 44 (in FIG. 4, the frame 42).

In the semiconductor device 400, a hollow portion 47 is formed with the wiring substrate 41, the protective member 44, and the wall member 45 being a bottom surface, a top surface, and side surfaces thereof, respectively. In other words, the semiconductor element 43 is placed in the hollow portion 47. A rectangular vent hole 48 extending in the height direction between the frame 42 and the protective member 44 is formed in the wall member 45. The vent hole 48 is a through hole which communicates the hollow portion 47 to/from the outside. In the vent hole 48, a pillar member 46 formed of a material having a linear expansion coefficient which is smaller than that of the wall member 45 is provided. The pillar member 46 is formed in the same shape (rectangular) as that of the vent hole 48 so as to close the vent hole 48 at ordinary temperature. Ordinary temperature as used herein refers to temperature around room temperature (for example, 25° C.).

One end 46a of the pillar member 46 in the height direction is in contact with one of the frame 42 and the protective member 44 (in FIG. 4, the protective member 44) at ordinary temperature. Further, the other end 46b of the pillar member 46 in the height direction is fixed to the other of the frame 42 and the protective member 44 (in FIG. 4, the frame 42). In other words, the one end 46a of the pillar member 46 and the protective member 44 are not in a state of being bonded together. Note that, the pillar member 46 and the wall member 45 are not in a state of being bonded together, either.

It is not necessarily required that the width of the pillar member 46 be the same as the bonded width of the wall member 45. The pillar member 46 may protrude from the contour of the protective member 44, or may protrude into the hollow portion 47. In this case, there is no fear that an end face of the pillar member 46 may be covered with the wall member 45, and thus, the vent hole 48 which communicates the hollow portion 47 to/from the outside opens with more reliability between the one end 46a of the pillar member 46 and the protective member 44.

Further, when the wiring substrate 41 is, for example, a ceramic substrate, if the frame 42 provided on the wiring substrate 41 is not formed of ceramic but formed of a resin material such as an epoxy resin, the wiring substrate 41 may be formed at lower cost than in a case in which the frame 42 is formed of ceramic.

As described above, according to the fourth embodiment, the wall member 45 has a linear expansion coefficient which is larger than that of the pillar member 46, and thus, when heated, expands more and becomes larger than the pillar member 46. The pillar member 46 is not in a state of being bonded to the protective member 44, and thus, when the wall member 45 expands and pushes up the protective member 44 in the height direction, the vent hole 48 which communicates the hollow portion 47 to/from the outside opens between the one end 46a of the pillar member 46 and the protective member 44. Gas having a vapor pressure in the hollow portion 47, which is caused when heated, may be relieved to the outside through the vent hole 48. On the other hand, at ordinary temperature, due to contraction of the wall member 45, the vent hole 48 closes and the airtightness of the hollow portion 47 is maintained. This may maintain the airtightness of the hollow portion 47 at ordinary temperature to prevent entry of foreign matters into the hollow portion 47 and may relieve gas having a vapor pressure in the hollow portion 47 when heated.

Further, when a wiring substrate having a frame portion for housing the semiconductor element 43 is formed, the cost of manufacturing the wiring substrate 41 may be reduced by forming the frame 42 with use of a material which is cheaper than the material of the wiring substrate 41 and placing the frame 42 on the wiring substrate 41, instead of processing the wiring substrate into the frame portion.

Note that, in the fourth embodiment, in order that the one end 46a of the pillar member 46 is in contact with the protective member 44 at ordinary temperature, the other end 46b is fixed to the frame 42, but the present invention is not limited thereto. Alternatively, in order that the one end of the pillar member 46 is in contact with the frame 42 at ordinary temperature, the other end may be fixed to the protective member 44. In this case, an end of the wall member 45 on a side to be fixed to the frame 42 is the one end, and an end of the wall member 45 on a side to be fixed to the protective member 44 is the other end. In this case, also, the effect and action similar to those of the above-mentioned fourth embodiment are obtained. Further, when a protective member having a frame portion for housing the semiconductor element is formed, also, the cost of manufacturing the protective member may be reduced by forming the frame with use of a material which is cheaper than the material of the protective member and placing the frame below the protective member.

Fifth Embodiment

Figure 5:
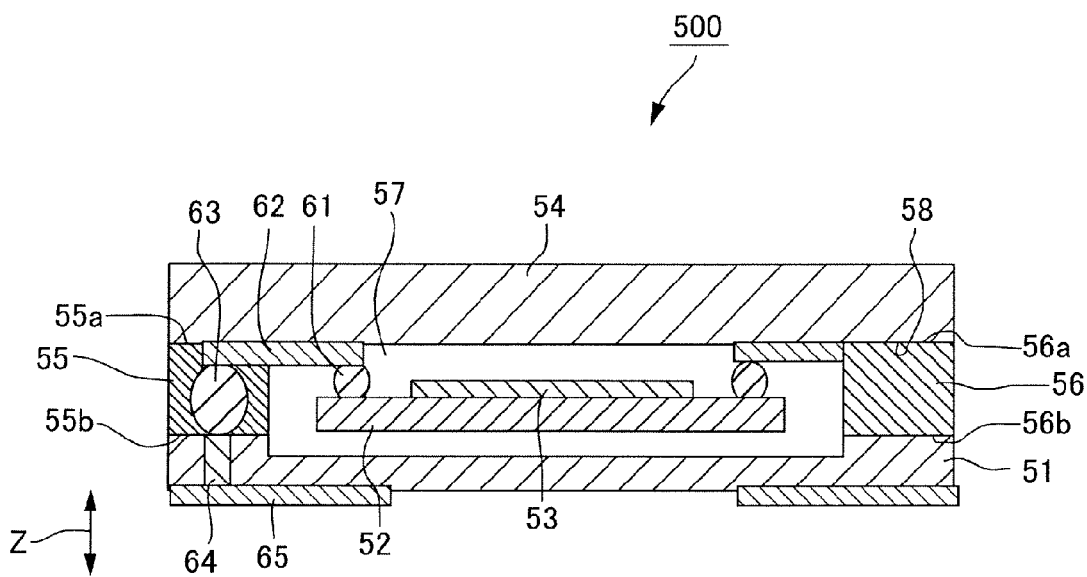
FIG. 5 is a sectional view illustrating a schematic structure of a semiconductor device according to a fifth embodiment of the present invention.

Next, a semiconductor device according to a fifth embodiment of the present invention is described. FIG. 5 is a sectional view of the semiconductor device according to the fifth embodiment of the present invention in a state at ordinary temperature.

As illustrated in FIG. 5, a semiconductor device 500 includes a wiring substrate 51, a protective member 54 spaced from the wiring substrate 51, and a semiconductor element 53 placed between the wiring substrate 51 and the protective member 54 and electrically connected to the wiring substrate 51. The semiconductor element 53 is an optical element having a function of any one of a light receiving portion and a light emitting portion or both thereof. Further, the protective member 54 has light permeability.

The semiconductor element 53 is displaced on a semiconductor substrate 52. The semiconductor element 53 and the semiconductor substrate 52 form a semiconductor chip. The protective member 54 has a wiring layer 62 provided thereon. The semiconductor substrate 52 is face-down mounted on the protective member 54. The semiconductor substrate 52 and the wiring layer 62 are electrically connected to each other through a bump 61. The wiring layer 62 and a wiring layer 65 of the wiring substrate 51 are electrically connected to each other through a bump 63 and a via hole 64. This electrically connects the semiconductor element 53 to the wiring substrate 51. In this way, when the semiconductor substrate 52 which is an optical element is face-down mounted on the protective member 54, also, the contour of the semiconductor device 500 may be made smaller.

Further, the semiconductor device 500 includes a wall member 55 which is placed between the wiring substrate 51 and the protective member 54 so as to surround the semiconductor element 53 and which thermally expands in the height direction (direction of the arrow Z) when heated. The wall member 55 is formed in the shape of a frame. The wall member 55 is formed of a cured adhesive. More specifically, the wall member 55 is formed of a material which bonds the wiring substrate 51 and the protective member 54 together.

Specifically, one end 55a of the wall member 55 in the height direction is bonded and fixed to one of the wiring substrate 51 and the protective member 54 (in FIG. 5, the protective member 54). Further, the other end 55b of the wall member 55 in the height direction is bonded and fixed to the other of the wiring substrate 51 and the protective member 54 (in FIG. 5, the wiring substrate 51).

The semiconductor substrate 52 is placed in a hollow portion formed with the wiring substrate 51, the protective member 54, and the wall member 55 being a bottom surface, a top surface, and side surfaces thereof, respectively. The semiconductor element 53 is mounted on a surface of the semiconductor substrate 52 on the protective member 54 side. A rectangular vent hole 58 extending in the height direction between the wiring substrate 51 and the protective member 54 is formed in the wall member 55. The vent hole 58 is a through hole which communicates the hollow portion 57 to/from the outside. In the vent hole 58, a pillar member 56 formed of a material having a linear expansion coefficient which is smaller than that of the wall member 55 is provided. The pillar member 56 is formed in the same shape (rectangular) as that of the vent hole 58 so as to close the vent hole 58 at ordinary temperature. Ordinary temperature as used herein refers to temperature around room temperature (for example, 25° C.).

One end 56a of the pillar member 56 in the height direction is in contact with one of the wiring substrate 51 and the protective member 54 (in FIG. 5, the protective member 54) at ordinary temperature. Further, the other end 56b of the pillar member 56 in the height direction is fixed to the other of the wiring substrate 51 and the protective member 54 (in FIG. 5, the wiring substrate 51). In other words, the one end 56a of the pillar member 56 and the protective member 54 are not in a state of being bonded together. Note that, the pillar member 56 and the wall member 55 are not in a state of being bonded together, either.

As described above, according to the fifth embodiment, the wall member 55 has a linear expansion coefficient which is larger than that of the pillar member 56, and thus, when heated, expands more and becomes larger than the pillar member 56. The pillar member 56 is not in a state of being bonded to the protective member 54, and thus, when the wall member 55 expands and pushes up the protective member 54 in the height direction, the vent hole 58 which communicates the hollow portion 57 to/from the outside opens between the one end 56a of the pillar member 56 and the protective member 54. Gas having a vapor pressure in the hollow portion 57, which is caused when heated, may be relieved to the outside through the vent hole 58. On the other hand, at ordinary temperature, due to contraction of the wall member 55, the vent hole 58 closes and the airtightness of the hollow portion 57 is maintained. This may maintain the airtightness of the hollow portion 57 at ordinary temperature to prevent entry of foreign matters into the hollow portion 57 and may relieve gas having a vapor pressure in the hollow portion 57 when heated.

Note that, in the fifth embodiment, in order that the one end 56a of the pillar member 56 is in contact with the protective member 54 at ordinary temperature, the other end 56b is fixed to the wiring substrate 51, but the present invention is not limited thereto. Alternatively, in order that the one end of the pillar member 56 is in contact with the wiring substrate 51 at ordinary temperature, the other end may be fixed to the protective member 54. In this case, an end of the wall member 55 on a side to be fixed to the wiring substrate 51 is the one end, and an end of the wall member 55 on a side to be fixed to the protective member 54 is the other end. In this case, also, the effect and action similar to those of the above-mentioned fifth embodiment are obtained.

Sixth Embodiment

Figure 6A:
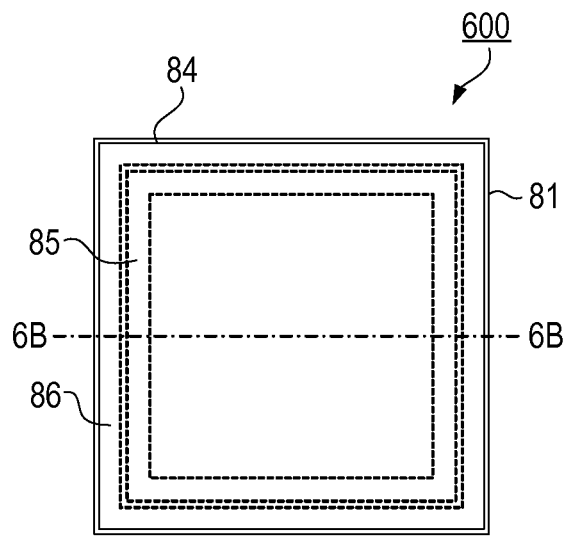
FIGS. 6A, 6B, and 6C are explanatory views illustrating a schematic structure of a semiconductor device according to a sixth embodiment of the present invention.
Figure 6B:
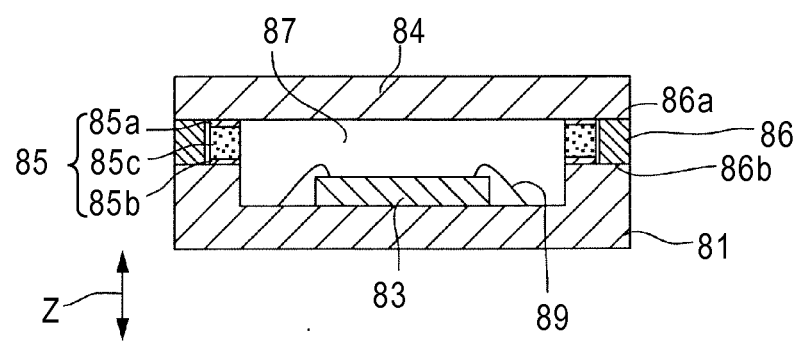
Figure 6C:
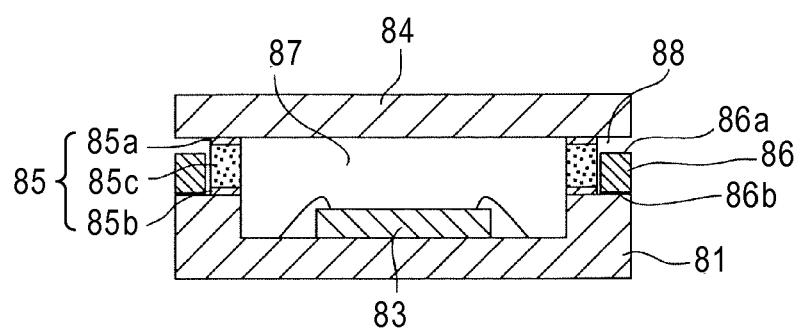

FIGS. 6A to 6C are explanatory views illustrating a schematic structure of a semiconductor device according to a sixth embodiment of the present invention. FIG. 6A is a plan view of the semiconductor device. FIG. 6B is a sectional view taken along the line 6B-6B of FIG. 6A of the semiconductor device in a state at ordinary temperature. FIG. 6C is a sectional view similar to FIG. 6B of the semiconductor device in a heated state.

As illustrated in FIGS. 6A to 6C, a semiconductor device 600 includes a wiring substrate 81, a protective member 84 spaced from the wiring substrate 81, and a semiconductor element 83 placed between the wiring substrate 81 and the protective member 84 and electrically connected to the wiring substrate 81. The semiconductor element 83 is face-up mounted on the wiring substrate 81, and is electrically connected to the wiring substrate 81 through metal wires 89.

Further, the semiconductor device 600 includes a first wall member 85 which is placed between the wiring substrate 81 and the protective member 84 so as to surround the semiconductor element 83 and which thermally expands in the height direction (direction of the arrow Z) when heated. Further, the semiconductor device 600 includes a second wall member 86 which is placed between the wiring substrate 81 and the protective member 84 so as to cover the outer peripheral surface of the first wall member 85 and which thermally expands in the height direction when heated. In other words, the second wall member 86 is placed on the outer peripheral side of the first wall member 85. The first wall member 85 and the second wall member 86 are formed in the shape of a frame.

One of the first wall member 85 and the second wall member 86 (in FIGS. 6A to 6C, the first wall member 85) includes a breathable porous layer 85c. More specifically, for the purpose of fixing both ends of the porous layer 85c in the height direction to the wiring substrate 81 and the protective member 84, respectively, the first wall member 85 has a bonding layer 85a which forms one end in the height direction and a bonding layer 85b which forms the other end in the height direction. In other words, one end of the first wall member 85 in the height direction is formed of the bonding layer 85a and the other end of the first wall member 85 in the height direction is formed of the bonding layer 85b. In this way, the first wall member 85 includes three layers which are the bonding layers 85a and 85b and the breathable porous layer 85c sandwiched therebetween.

The bonding layer 85a of the first wall member 85 is bonded and fixed to one of the wiring substrate 81 and the protective member 84 (in FIGS. 6A to 6C, the protective member 84), and the bonding layer 85b of the first wall member 85 in the height direction is bonded and fixed to the other of the wiring substrate 81 and the protective member 84 (in FIGS. 6A to 6C, the wiring substrate 81).

On the other hand, the other of the first wall member 85 and the second wall member 86 (in FIGS. 6A to 6C, the second wall member 86) is formed of a material having a linear expansion coefficient which is smaller than that of the first wall member 85.

In order that one end 86a of the second wall member 86 in the height direction is in contact with the protective member 84 out of the wiring substrate 81 and the protective member 84 at ordinary temperature as illustrated in FIG. 6B, the other end 86b of the second wall member 86 in the height direction is fixed to the wiring substrate 81 out of the wiring substrate 81 and the protective member 84. By placing the second wall member 86 in the shape of a frame in this way, the protective member 84 may be mounted with the distance between the protective member 84 and the wiring substrate 1 being accurately controlled.

In the semiconductor device 600, a hollow portion 87 is formed with the wiring substrate 81, the protective member 84, and the first wall member 85 being a bottom surface, a top surface, and side surfaces thereof, respectively. In other words, the semiconductor element 83 is placed in the hollow portion 87. Ordinary temperature as used herein includes heat generation temperature when the semiconductor element 83 operates (about 70° C.). Therefore, even when the temperature of air in the hollow portion 87 rises by the operation of the semiconductor element 83, the one end 86a of the second wall member 86 and the protective member 84 maintain the contact state.

It is preferred that a material for forming the first wall member 85 contain a resin material having a large linear expansion coefficient. For example, a thermosetting epoxy resin sheet having a thickness of 20 μm is used as the bonding layers 85a and 85b, and porous PTFE having a thickness of 150 μm is used as the breathable porous layer 85c. In this case, the first wall member 85 has a glass transition point of about 80° C. and linear expansion coefficients α1 and α2 of about 0.55 to $0.65 \times 10^{-4}$/K and about 1.1 to $1.3 \times 10^{-4}$/K, respectively.

It is desired that the bonded width of the first wall member 85 be set depending on the volume of the hollow portion 87 in which vapor pressure is caused. For example, when the volume of the hollow portion 87 is about 40 mm³, about 60 mm³, and about 80 mm³, the bonded width of the first wall member 85 is about 0.8 mm, 1.0 mm, and 1.3 mm, respectively.

Further, in order that the second wall member 86 is not fixed to the protective member 84 by the bonding layer 85a of the first wall member 85, it is desired that the first wall member 85 and the second wall member 86 be spaced from each other. For example, when the bonding layer 85a is a thermosetting epoxy resin sheet having a thickness of about 20 μm, spread of the bonding layer 85a in the bonding by the first wall member 85 is about 20 μm which is the same as the thickness of the bonding layer 85a. Therefore, the first wall member 85 and the second wall member 86 are placed at a distance of 20 μm or more from each other. Further, a coating layer, such as a fluororesin having low adhesion to the bonding layer 85a, may be provided on a surface of the second wall member 86. In this case, bonding between the bonding layer 85a and the second wall member 86 may be suppressed and the need for providing space between the first wall member 85 and the second wall member 86 is eliminated.

It is preferred that a material for forming the first wall member 86 be, for example, an inorganic material having a small linear expansion coefficient such as a metal or a ceramic. For example, with regard to metals, Au has a linear expansion coefficient of about $0.14 \times 10^{-4}$/K, and Cu has a linear expansion coefficient of about $0.17 \times 10^{-4}$/K. Alumina, which is a ceramic, has a linear expansion coefficient of about 0.07 to $0.08 \times 10^{-4}$/K.

In order to secure sufficient airtightness of the hollow portion 87, it is desired that the width of the second wall member 86 be substantially the same as or larger than the bonded width of the first wall member 85. As the wiring substrate 81 of the sixth embodiment, a hard substrate such as a glass epoxy based substrate, a ceramic based substrate, or an aluminum insulating substrate, a flexible substrate such as an FPC or a TAB, a light-permeable substrate such as a glass substrate, or the like may be used.

As the wiring substrate 81, a wiring substrate 81 in which a frame portion for housing the semiconductor element 83 is separately formed may also be used. When the wiring substrate 81 having the frame portion for housing the semiconductor element 83 is formed, the cost of manufacturing the wiring substrate 81 may be reduced by forming the frame with use of a material which is cheaper than the material of the wiring substrate 81 and placing the frame, instead of processing the wiring substrate 81 into the frame portion.

As the protective member 84, for example, a metal plate, a ceramic plate, or a glass plate may be used. Further, the protective member 84 of the sixth embodiment may include a wiring layer.

As the protective member 84, a protective member 84 in which a frame portion for housing the semiconductor element 83 is separately formed may also be used. When the protective member 84 having the frame portion for housing the semiconductor element 83 is formed, the cost of manufacturing the protective member 84 may be reduced by forming the frame with use of a material which is cheaper than the material of the protective member 84 and placing the frame, instead of processing the protective member 84 into the frame portion.

Further, with regard to the method of forming the second wall member 86, a layer of a base material of the wiring substrate 81 may be used or multiple layers of the base material may be stacked. Alternatively, the second wall member 86 may be formed simultaneously with formation of metal wiring of the wiring substrate 81 by the same manufacturing method as that of the metal wiring, or the second wall member 86 may be formed by machining or etching when the wiring substrate 81 is formed. In this case, the second wall member 86 may be formed simultaneously when the wiring substrate 81 is formed, and thus, an extra step of placing the second wall member 86 is unnecessary.

Next, action of the semiconductor device 600 is described. As illustrated in FIG. 6C, when the second wall member 86 is not in a state of being bonded to the protective member 84, the first wall member 85 expands by heating and pushes up the protective member 84. Further, the expansion of the first wall member 85 by heating becomes larger than that of the second wall member 86 due to the difference in linear expansion coefficient. Therefore, a vent gap 88 is formed between the one end 86a of the second wall member 86 and the protective member 84. Vapor pressure caused in the hollow portion 87 by heating may be relieved to the outside through the vent gap 88 via the porous layer 85c, and thus, separation and damage of the protective member 84 may be prevented.

For example, the first wall member 85 having a thickness (height) of 190 μm at ordinary temperature (25° C.) is used, in which a thermosetting epoxy resin sheet is used as the bonding layers 85a and 85b and porous PTFE is used as the porous layer 85c. In this case, the first wall member 85 has a glass transition point of about 80° C. and linear expansion coefficients α1 and α2 of about $0.60 \times 10^{-4}$/K and about $1.2 \times 10^{-4}$/K, respectively. Further, alumina having a linear expansion coefficient of $0.07 \times 10^{-4}$/K is used as the first wall member 85.

The height of the first wall member 85 is about 190.5 μm in a state of being heated to, for example, 70° C. by heat generated when the semiconductor element 83 operates. Therefore, in order that the vent gap 88 is not formed even when the entire semiconductor device 600 is heated during the operation of the semiconductor element 83, the second wall member 86 is formed so as to have a height of 190.5 μm at ordinary temperature and the protective member 84 is thermocompression bonded to the wiring substrate 81.

The thermocompression bonding is carried out at 200° C. or higher, and thus, the height of the first wall member 85 is 193 μm or more. Therefore, in the thermocompression bonding, the bonding layers 85a and 85b of the first wall member 85 may bond the wiring substrate 81 and the protective member 84 together with stability. Further, at ordinary temperature, due to contraction, the protective member 84 and the one end 86a of the second wall member 86 are in intimate contact with each other. By setting the heights of the first wall member 85 and the second wall member 86 in this way, the vent gap 88 is not formed when the semiconductor element 83 operates.

Further, when the semiconductor device 600 is heated to 100° C. which is the boiling point of water, the vent gap 88 of about 0.4 μm is formed. Further, in reflow mounting on a motherboard, when the reflow heating temperature is 220° C., the vent gap 88 of about 3.0 μm is formed between the protective member 84 and the one end 86a of the second wall member 86, and thus, water vapor in the hollow portion 87 may be sufficiently released through the vent gap 88 to the outside.

At ordinary temperature, the first wall member 85 and the second wall member 86 return to their original heights and return to the state illustrated in FIG. 6B, and thus, the vent gap 88 closes and the airtightness of the hollow portion 87 is maintained.

Further, for example, in reflow mounting on a motherboard, when the reflow heating temperature is 250° C., the heights of the first wall member 85 and the second wall member 86 at ordinary temperature are set so that the vent gap 88 at that temperature is 0 μm. In that case, also, the first wall member 85 is in a temperature range of the glass transition point or higher and the porous layer 85c has a low elastic modulus of 50 MPa or less at 100° C. or higher, and thus, internal pressure rise of the hollow portion 87 pushes up the protective member 84 to form the vent gap 88.

As described above, according to the sixth embodiment, the second wall member 86 has a linear expansion coefficient which is smaller than that of the first wall member 85, and thus, during heating in reflow mounting or the like on a motherboard, the amount of expansion of the second wall member 86 is smaller than that of the first wall member 85. Conversely, the first wall member 85 has a linear expansion coefficient which is larger than that of the second wall member 86, and thus, during heating, the amount of expansion of the first wall member 85 is larger than that of the second wall member 86. Therefore, the vent gap 88 is formed between the protective member 84, which is pushed up by the first wall member 85, and the second wall member 86. This releases water vapor in the hollow portion 87 through the porous layer 85c and the vent gap 88 to the outside, and pressure rise in the hollow portion 87 by water vapor caused when heated may be suppressed. Therefore, separation of the protective member 84 may be prevented.

Further, even when the vent gap 88 is formed, the porous layer 85c exists between the hollow portion 87 and the outside, and thus, the porous layer 85c functions as a filter and entry of foreign matters from the outside into the hollow portion 87 may be suppressed.

On the other hand, at ordinary temperature, due to contraction of the first wall member 85, the vent gap 88 closes and the hollow portion 87 is insulated from the outside, and thus, entry of air containing water vapor of the outside through the porous layer 85c into the hollow portion 87 may be suppressed.

In this way, at ordinary temperature, the airtightness of the hollow portion 87 may be maintained, thereby preventing entry of foreign matters into the hollow portion 87. Further, when heated, vapor pressure in the hollow portion 87 may be relieved.

Note that, in the above-mentioned sixth embodiment, the one wall member is the first wall member 85 and the other wall member is the second wall member 86, but the present invention is not limited thereto. The one wall member may be the second wall member 86 and the other wall member may be the first wall member 85. More specifically, the outer wall member 86 may be a wall member including a porous layer. In this case, also, the effect and action similar to those of the above-mentioned sixth embodiment are obtained.

Further, in the sixth embodiment, in order that the one end 86a of the second wall member 86 is in contact with the protective member 84 at ordinary temperature, the other end 86b is fixed to the wiring substrate 81, but the present invention is not limited thereto. Alternatively, in order that the one end of the second wall member 86 is in contact with the wiring substrate 81 at ordinary temperature, the other end may be fixed to the protective member 84. In this case, an end of the first wall member 85 on a side to be fixed to the wiring substrate 81 is the one end, and an end of the first wall member 85 on a side to be fixed to the protective member 84 is the other end. In this case, also, the effect and action similar to those of the above-mentioned sixth embodiment are obtained.

Further, in the above description, the first wall member 85 as the one wall member has a three-layer structure, but the present invention is not limited thereto. In the case where the porous layer is formed so that both ends of the porous layer are bonded and fixed to the wiring substrate 81 and the protective member 84, respectively, one layer of the porous layer may form the one wall member.

Seventh Embodiment

Figure 7A:
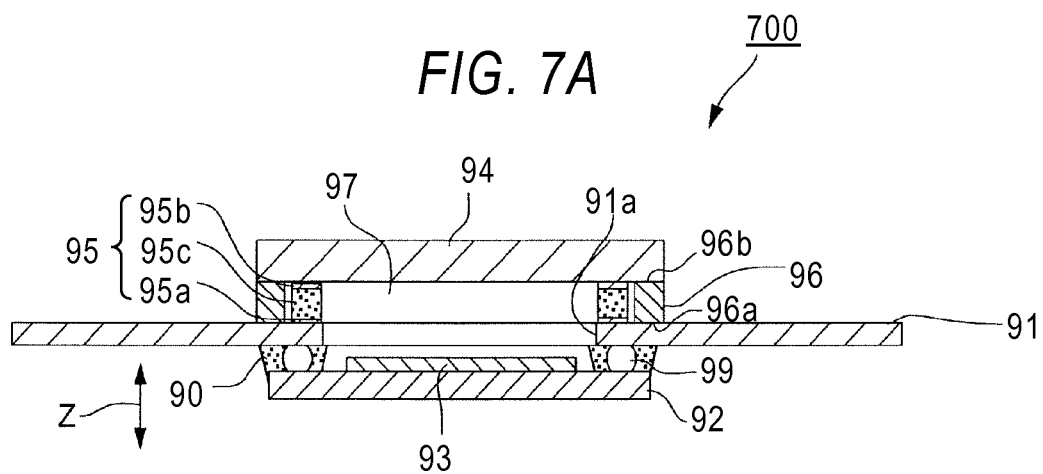
FIGS. 7A and 7B are sectional views illustrating a schematic structure of a semiconductor device according to a seventh embodiment of the present invention.
Figure 7B:
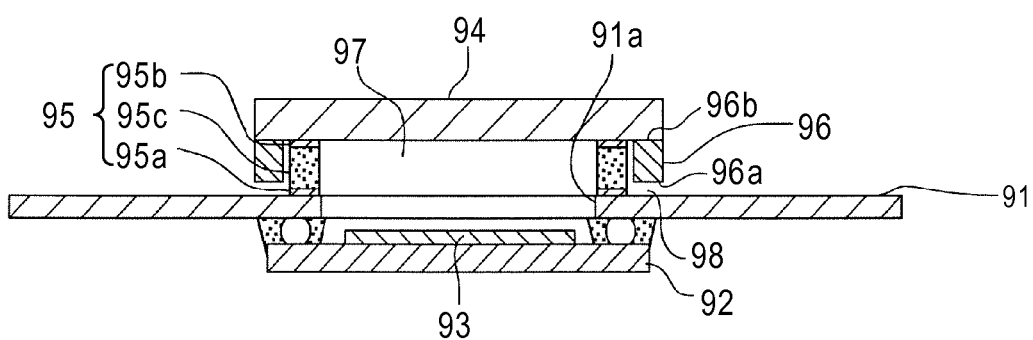

Next, a semiconductor device according to a seventh embodiment of the present invention is described. FIGS. 7A and 7B are explanatory views illustrating a schematic structure of the semiconductor device according to the seventh embodiment of the present invention. FIG. 7A is a sectional view of the semiconductor device in a state at ordinary temperature. FIG. 7B is a sectional view of the semiconductor device in a heated state.

As illustrated in FIGS. 7A and 7B, a semiconductor device 700 includes a wiring substrate 91 having an opening portion 91a formed therein and a protective member 94 spaced from the wiring substrate 91. Further, the semiconductor device 700 includes a semiconductor substrate 92 which is placed at a position opposed to the protective member 94 through the opening portion 91a of the wiring substrate 91 and which is electrically connected to the wiring substrate 91. Further, the semiconductor device 700 includes a semiconductor element 93 which is mounted on the semiconductor substrate 92 at a position corresponding to the opening portion 91a of the wiring substrate 91. In other words, the semiconductor substrate 92 is placed on a side opposite to the protective member 94 with respect to the wiring substrate 91, and the semiconductor element 93 is opposed to the protective member 94 through the opening portion 91a. The semiconductor element 93 and the semiconductor substrate 92 form a semiconductor chip.

The semiconductor element 93 is an optical element having a function of any one of a light receiving portion and a light emitting portion or both thereof. The protective member 94 has light permeability. The semiconductor element 93 is displaced on the semiconductor substrate 92. The semiconductor element 93 and the semiconductor substrate 92 form a semiconductor chip. The semiconductor substrate 92 is face-down mounted on the wiring substrate 91. The wiring substrate 91 and the semiconductor substrate 92 are electrically connected to each other through a bump 99. Further, the periphery of the bump 99 is covered with an underfill resin 90, and hence the space between the wiring substrate 91 and the semiconductor substrate 92 is sealed.

Further, the semiconductor device 700 includes a first wall member 95 which is placed between the wiring substrate 91 and the protective member 94 so as to surround the semiconductor element 93 and which thermally expands in the height direction (direction of the arrow Z) when heated. Further, the semiconductor device 700 includes a second wall member 96 which is placed between the wiring substrate 91 and the protective member 94 so as to surround the first wall member 95 and which thermally expands in the height direction when heated. In other words, the second wall member 96 is placed on the outer peripheral side of the first wall member 95. The first wall member 95 and the second wall member 96 are formed in the shape of a frame.

One of the first wall member 95 and the second wall member 96 (in the seventh embodiment, the first wall member 95) includes a breathable porous layer 95c. More specifically, for the purpose of fixing both ends of the porous layer 95c in the height direction to the wiring substrate 91 and the protective member 94, respectively, the first wall member 95 has a bonding layer 95a which forms one end in the height direction and a bonding layer 95b which forms the other end in the height direction. In other words, one end of the first wall member 95 in the height direction is formed of the bonding layer 95a and the other end of the first wall member 95 in the height direction is formed of the bonding layer 95b. In this way, the first wall member 95 includes three layers which are the bonding layers 95a and 95b and the breathable porous layer 95c sandwiched therebetween.

In the seventh embodiment, the bonding layer 95a of the first wall member 95 is bonded and fixed to one of the wiring substrate 91 and the protective member 94 (in FIGS. 7A and 7B, the wiring substrate 91), and the bonding layer 95b of the first wall member 95 in the height direction is bonded and fixed to the other of the wiring substrate 91 and the protective member 94 (in FIGS. 7A and 7B, the protective member 94).

On the other hand, the other of the first wall member 95 and the second wall member 96 (in FIGS. 7A and 7B, the second wall member 96) is formed of a material having a linear expansion coefficient which is smaller than that of the first wall member 95.

One end 96a of the second wall member 96 in the height direction is in contact with the wiring substrate 91 out of the wiring substrate 91 and the protective member 94 at ordinary temperature as illustrated in FIG. 7A. Further, the other end 96b of the second wall member 96 in the height direction is fixed to the protective member 94 out of the wiring substrate 91 and the protective member 94.

In the semiconductor device 700, a hollow portion 97 is formed with the semiconductor substrate 92 being a bottom surface, with the protective member 94 being a top surface, and with the wall member 95, side surfaces of the opening portion in the wiring substrate 91 and the resin 90 encapsulating the bump 99 being side surfaces thereof. The hollow portion 97 is formed by being surrounded by the wiring substrates 91 and 92, the protective member 94, and the first wall member 95. In other words, the semiconductor element 93 is placed in the hollow portion 97. Ordinary temperature as used herein includes heat generation temperature when the semiconductor element 93 operates (about 70° C.). Therefore, even when the temperature of air in the hollow portion 97 rises by the operation of the semiconductor element 93, the one end 96a of the second wall member 96 and the protective member 94 maintain the contact state.

Further, with regard to the method of forming the second wall member 96 of the seventh embodiment, the second wall member 96 may be formed by machining or etching when the protective member 94 is formed. In this case, the second wall member 96 may be formed simultaneously when the protective member 94 is formed, and thus, an extra step of placing the second wall member 96 is unnecessary.

Next, action of the semiconductor device 700 is described. The second wall member 96 is fixed to the protective member 94 and is in contact with the wiring substrate 91 at ordinary temperature. Therefore, as illustrated in FIG. 7B, the first wall member 95 expands by heating and pushes up the protective member 94. Further, the expansion of the first wall member 95 by heating becomes larger than that of the second wall member 96 due to the difference in linear expansion coefficient. Therefore, a vent gap 98 is formed between the one end 96a of the second wall member 96 and the wiring substrate 91. Vapor pressure caused in the hollow portion 97 by heating may be thus relieved to the outside through the porous layer 95c from the vent gap 98, and thus, separation and damage of the protective member 94 and the semiconductor substrate 92 may be prevented. At ordinary temperature, the first wall member 95 and the second wall member 96 return to their original sizes and return to the state illustrated in FIG. 7A, and thus, the vent gap 98 closes and the airtightness of the hollow portion 97 is maintained.

For example, the first wall member 95 having a height of 200 μm at ordinary temperature of 95° C. is used, in which a thermosetting epoxy resin sheet is used as the bonding layers 95a and 95b and porous PTFE is used as the porous layer 95c.

In this case, the first wall member 95 has a glass transition point of about 80° C. and linear expansion coefficients $\alpha 1$ and $\alpha 2$ of about $0.65 \times 10^{-4}$/K and about $1.3 \times 10^{-4}$/K, respectively. Further, copper having a height of 200.6 μm and a linear expansion coefficient of $0.17 \times 10^{-4}$/K is used as the second wall member 96.

The height of the first wall member 95 is about 200.6 μm in a state of being heated to, for example, 70° C. by heat generated when the semiconductor element 93 operates. Therefore, the vent gap 98 is not formed when the semiconductor element 93 operates.

Further, when the semiconductor device 700 of the seventh embodiment is heated to 100° C. which is the boiling point of water, the vent gap 98 of about 0.5 μm is formed. Further, in reflow mounting on a motherboard, when the reflow heating temperature is 220° C., the vent gap 98 of about 3.2 μm is formed between the wiring substrate 91 and the second wall member 96, and thus, water vapor in the hollow portion 97 may be sufficiently released through the vent gap 98 to the outside.

As described above, according to the seventh embodiment, the second wall member 96 has a linear expansion coefficient which is smaller than that of the first wall member 95, and thus, during heating in reflow mounting or the like on a motherboard, the amount of expansion of the second wall member 96 is smaller than that of the first wall member 95. Conversely, the first wall member 95 has a linear expansion coefficient which is larger than that of the second wall member 96, and thus, during heating, the amount of expansion of the first wall member 95 is larger than that of the second wall member 96. Therefore, the protective member 94 is pushed up by the first wall member 95, and the vent gap 98 is formed between the wiring substrate 91 and the one end 96a of the second wall member 96. This releases water vapor in the hollow portion 97 through the porous layer 95c and the vent gap 98 to the outside, and pressure rise in the hollow portion 97 by water vapor caused when heated may be suppressed. Therefore, separation of the semiconductor substrate 92, on which the semiconductor element 93 is mounted, and the protective member 94 may be prevented.

Further, even when the vent gap 98 is formed, the porous layer 95c exists between the hollow portion 97 and the outside, and thus, the porous layer 95c functions as a filter and entry of foreign matters from the outside into the hollow portion 97 may be suppressed.

On the other hand, at ordinary temperature, due to contraction of the first wall member 95, the vent gap 98 closes and the hollow portion 97 is insulated from the outside, and thus, entry of air containing water vapor of the outside through the porous layer 95c into the hollow portion 97 may be suppressed.

In this way, at ordinary temperature, the airtightness of the hollow portion 97 may be maintained, thereby preventing entry of foreign matters into the hollow portion 97. Further, when heated, vapor pressure in the hollow portion 97 may be relieved.

Note that, in the seventh embodiment, the one wall member is the first wall member 95 and the other wall member is the second wall member 96, but the present invention is not limited thereto. The one wall member may be the second wall member 96 and the other wall member may be the first wall member 95. More specifically, the outer wall member 96 may be a wall member including a porous layer. In this case, also, the effect and action similar to those of the above-mentioned seventh embodiment are obtained.

Further, in the seventh embodiment, in order that the one end 96a of the second wall member 96 is in contact with the wiring substrate 91 at ordinary temperature, the other end 96*b* is fixed to the protective member 94, but the present invention is not limited thereto. Alternatively, in order that the one end of the second wall member 96 is in contact with the protective member 94 at ordinary temperature, the other end may be fixed to the wiring substrate 91. In this case, an end of the first wall member 95 on a side to be fixed to the protective member 94 is the one end, and an end of the first wall member 95 on a side to be fixed to the wiring substrate 91 is the other end. In this case, also, the effect and action similar to those of the above-mentioned seventh embodiment are obtained.

Further, in the above description, the first wall member 95 as the one wall member has a three-layer structure, but the present invention is not limited thereto. In the case where the porous layer is formed so that both ends of the porous layer are bonded and fixed to the wiring substrate 91 and the protective member 94, respectively, one layer of the porous layer may form the one wall member.

Eighth Embodiment

Figure 8:
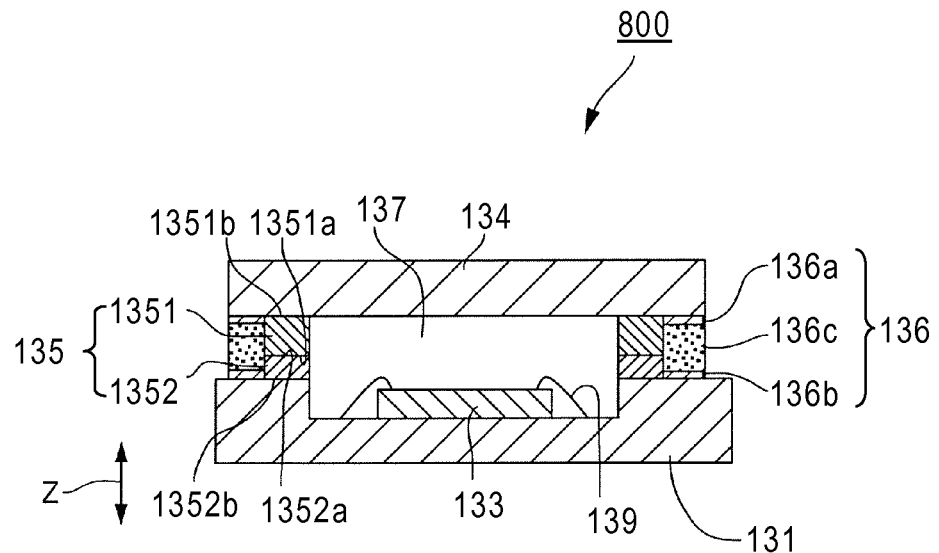
FIG. 8 is a sectional view illustrating a schematic structure of a semiconductor device according to an eighth embodiment of the present invention.

Next, a semiconductor device according to an eighth embodiment of the present invention is described. FIG. 8 is a sectional view of the semiconductor device according to the eighth embodiment in a state at ordinary temperature.

As illustrated in FIG. 8, a semiconductor device 800 includes a wiring substrate 131, a protective member 134 spaced from the wiring substrate 131, and a semiconductor element 133 placed between the wiring substrate 131 and the protective member 134 and electrically connected to the wiring substrate 131. The semiconductor element 133 is face-up mounted on the wiring substrate 131, and is electrically connected to the wiring substrate 131 through metal wires 139.

Further, the semiconductor device 800 includes a second wall member 135 which is placed between the wiring substrate 131 and the protective member 134 so as to surround the semiconductor element 133 and which thermally expands in the height direction (direction of the arrow Z) when heated. Further, the semiconductor device 800 includes a first wall member 136 which is placed between the wiring substrate 131 and the protective member 134 so as to surround the second wall member 135 and which thermally expands in the height direction when heated. In other words, the first wall member 136 is placed so as to cover the outer peripheral surface of the second wall member 135. The second wall member 135 and the first wall member 136 are formed in the shape of a frame.

One of the second wall member 135 and the first wall member 136 (in FIG. 8, the first wall member 136) includes a breathable porous layer 136*c*. More specifically, for the purpose of fixing both ends of the porous layer 136*c* in the height direction to the wiring substrate 131 and the protective member 134, respectively, the first wall member 136 has a bonding layer 136*a* which forms one end in the height direction and a bonding layer 136*b* which forms the other end in the height direction. In other words, one end of the first wall member 136 in the height direction is formed of the bonding layer 136*a* and the other end of the first wall member 136 in the height direction is formed of the bonding layer 136*b*. In this way, the first wall member 136 includes three layers which are the bonding layers 136*a* and 136*b* and the breathable porous layer 136*c* sandwiched therebetween.

In the eighth embodiment, the bonding layer 136*a* of the first wall member 136 is bonded and fixed to one of the wiring substrate 131 and the protective member 134 (in FIG. 8, the protective member 134), and the bonding layer 136*b* of the first wall member 136 in the height direction is bonded and fixed to the other of the wiring substrate 131 and the protective member 134 (in FIG. 8, the wiring substrate 131).

On the other hand, the other of the second wall member 135 and the first wall member 136 (in FIG. 8, the second wall member 135) is formed of a material having a linear expansion coefficient which is smaller than that of the first wall member 136.

Further, the second wall member 135 includes a pair of wall portions 1351 and 1352 which are opposed to each other. One ends 1351*a* and 1352*a* of the pair of wall portions 1351 and 1352 in the height direction, respectively, are in contact with each other at ordinary temperature. Further, the other ends 1351*b* and 1352*b* of the pair of wall portions 1351 and 1352 in the height direction are fixed to the protective member 134 and the wiring substrate 131, respectively. In other words, the other end 1351*b* of one wall portion 1351 is fixed to the protective member 134 and the other end 1352*b* of the other wall portion 1352 is fixed to the wiring substrate 131.

In the semiconductor device 800, a hollow portion 137 is formed with the wiring substrate 131, the protective member 134, and the second wall member 135 being a bottom surface, a top surface, and side surfaces thereof, respectively. The hollow portion 137 is formed by being surrounded by the wiring substrate 131, the protective member 134, and the second wall member 135. In other words, the semiconductor element 133 is placed in the hollow portion 137. Ordinary temperature as used herein includes heat generation temperature when the semiconductor element 133 operates (about 70° C.). Therefore, even when the temperature of air in the hollow portion 137 rises by the operation of the semiconductor element 133, the one end 136*a* of the first wall member 136 and the protective member 134 maintain the contact state.

The height (thickness) of the wall portion 1351 is set to be larger than the height (thickness) of the bonding layer 136*a* and the height (thickness) of the wall portion 1352 is set to be larger than the height (thickness) of the bonding layer 136*b*. By providing the wall portions 1351 and 1352 in this way, the portions at which the wall portions 1351 and 1352 are in contact with each other (the one ends 1351*a* and 1352*a*) are not covered with the bonding layers 136*a* and 136*b*. Therefore, the need for providing space between the wall portions 1351 and 1352 and the first wall member 136 is eliminated. Further, by providing the wall portions 1351 and 1352 in this way, the bonding layers 136*a* and 136*b* may be prevented from protruding into the hollow portion 137.

As described above, according to the eighth embodiment, the second wall member 135 has a linear expansion coefficient which is smaller than that of the first wall member 136, and thus, during heating in reflow mounting or the like on a motherboard, the amount of expansion of the second wall member 135 is smaller than that of the first wall member 136. Conversely, the first wall member 136 has a linear expansion coefficient which is larger than that of the second wall member 135, and thus, during heating, the amount of expansion of the first wall member 136 is larger than that of the second wall member 135. Therefore, the protective member 134 is pushed up by the first wall member 136, and a vent gap is formed between the one end 1351*a* of the wall portion 1351 and the one end 1352*a* of the wall portion 1352. This releases water vapor in the hollow portion 137 through the vent gap and the porous layer 136*c* to the outside, and pressure rise in the hollow portion 137 by water vapor caused when heated may be suppressed. Therefore, separation of the protective member 134 may be prevented.

Further, even when the vent gap is formed, the porous layer 136*c* exists between the hollow portion 137 and the outside, and thus, the porous layer 136c functions as a filter and entry of foreign matters from the outside into the hollow portion 137 may be suppressed.

On the other hand, at ordinary temperature, due to contraction of the first wall member 136, the vent gap closes and the hollow portion 137 is insulated from the outside, and thus, entry of air containing water vapor from the outside through the porous layer 136c into the hollow portion 137 may be suppressed.

In this way, at ordinary temperature, the airtightness of the hollow portion 137 may be maintained, thereby preventing entry of foreign matters into the hollow portion 137. Further, when heated, vapor pressure in the hollow portion 137 may be relieved.

Note that, in the eighth embodiment, the one wall member is the first wall member 136 and the other wall member is the second wall member 135, but the present invention is not limited thereto. The one wall member may be the second wall member 135 and the other wall member may be the first wall member 136. More specifically, the inner wall member 135 may be a wall member including a porous layer. In this case, also, the effect and action similar to those of the above-mentioned eighth embodiment are obtained.

Further, in the above description, the first wall member 136 as the one wall member has a three-layer structure, but the present invention is not limited thereto. In the case where the porous layer is formed so that both ends of the porous layer are bonded and fixed to the wiring substrate 131 and the protective member 134, respectively, one layer of the porous layer may form the one wall member.

Ninth Embodiment

Figure 9:
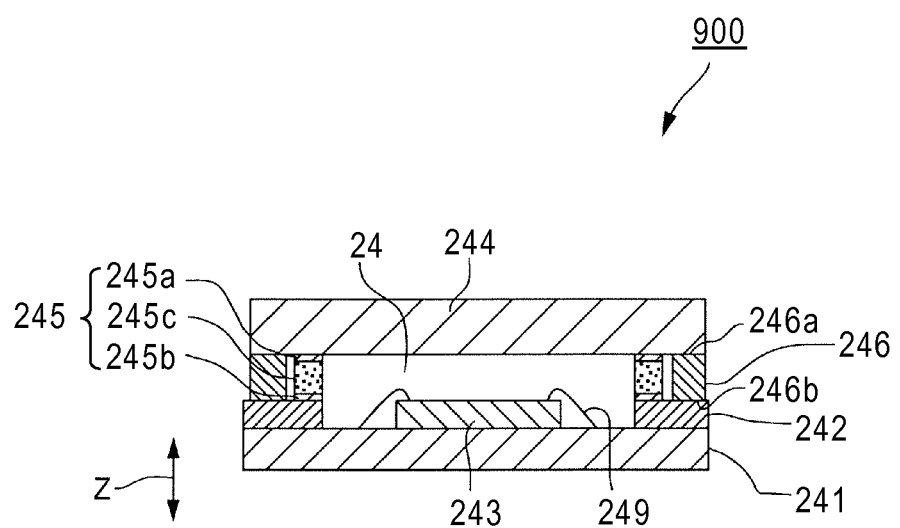
FIG. 9 is a sectional view illustrating a schematic structure of a semiconductor device according to a ninth embodiment of the present invention.

Next, a semiconductor device according to a ninth embodiment of the present invention is described. FIG. 9 is a sectional view of the semiconductor device according to the ninth embodiment in a state at ordinary temperature.

As illustrated in FIG. 9, a semiconductor device 900 includes a wiring substrate 241, a protective member 244 spaced from the wiring substrate 241, and a semiconductor element 243 placed between the wiring substrate 241 and the protective member 244 and electrically connected to the wiring substrate 241. The semiconductor element 243 is face-up mounted on the wiring substrate 241, and is electrically connected to the wiring substrate 241 through metal wires 249.

Further, the semiconductor device 900 includes a frame 242 which is placed between the wiring substrate 241 and the protective member 244 so as to surround the semiconductor element 243 and which is fixed to the wiring substrate 241. Further, the semiconductor device 900 includes a first wall member 245 which is placed between the frame 242 and the protective member 244 so as to surround the semiconductor element 243 and which thermally expands in the height direction (direction of the arrow Z) when heated. Further, the semiconductor device 900 includes a second wall member 246 which is placed between the frame 242 and the protective member 244 so as to surround the first wall member 245 and which thermally expands in the height direction when heated. More specifically, the first wall member 245 in the shape of a frame and the second wall member 246 in the shape of a frame on the outer peripheral side of the first wall member 245 are placed between the frame 242 and the protective member 244.

One of the first wall member 245 and the second wall member 246 (in FIG. 9, the first wall member 245) includes a breathable porous layer 245c. More specifically, for the purpose of fixing both ends of the porous layer 245c in the height direction to the frame 242 and the protective member 244, respectively, the first wall member 245 has a bonding layer 245a which forms one end in the height direction and a bonding layer 245b which forms the other end in the height direction. In other words, one end of the first wall member 245 in the height direction is formed of the bonding layer 245a and the other end of the first wall member 245 in the height direction is formed of the bonding layer 245b. In this way, the first wall member 245 includes three layers which are the bonding layers 245a and 245b and the breathable porous layer 245c sandwiched therebetween.

In the ninth embodiment, the bonding layer 245a of the first wall member 245 is bonded and fixed to one of the frame 242 and the protective member 244 (in FIG. 9, the protective member 244), and the bonding layer 245b of the first wall member 245 in the height direction is bonded and fixed to the other of the frame 242 and the protective member 244 (in FIG. 9, the frame 242).

On the other hand, the other of the first wall member 245 and the second wall member 246 (in the ninth embodiment, the second wall member 246) is formed of a material having a linear expansion coefficient which is smaller than that of the first wall member 245.

One end 246a of the second wall member 246 in the height direction is in contact with the protective member 244 out of the frame 242 and the protective member 244 at ordinary temperature. Further, the other end 246b of the second wall member 246 in the height direction is fixed to the frame 242 out of the frame 242 and the protective member 244.

In the semiconductor device 900, a hollow portion 247 is formed with the wiring substrate 241, the protective member 244, and the first wall member 245 being a bottom surface, a top surface, and side surfaces thereof, respectively. In other words, the semiconductor element 243 is placed in the hollow portion 247. Ordinary temperature as used herein includes heat generation temperature when the semiconductor element 243 operates (about 70° C.). Therefore, even when the temperature of air in the hollow portion 247 rises by the operation of the semiconductor element 243, the one end 246a of the second wall member 246 and the protective member 244 maintain the contact state.

Here, when the wiring substrate 241 is, for example, a ceramic substrate, if the frame portion for housing the semiconductor element 243 is not formed of ceramic but formed of a resin material such as an epoxy resin as a frame 242, the wiring substrate 241 may be formed at lower cost than in a case in which the frame portion is formed of ceramic.

As described above, according to the ninth embodiment, the second wall member 246 has a linear expansion coefficient which is smaller than that of the first wall member 245, and thus, during heating in reflow mounting or the like on a motherboard, the amount of expansion of the second wall member 246 is smaller than that of the first wall member 245. Conversely, the first wall member 245 has a linear expansion coefficient which is larger than that of the second wall member 246, and thus, during heating, the amount of expansion of the first wall member 245 is larger than that of the second wall member 246. Therefore, a vent gap is formed between the protective member 244, which is pushed up by the first wall member 245, and the one end 246a of the second wall member 246. This releases water vapor in the hollow portion 247 through the porous layer 245c and the vent gap to the outside, and pressure rise in the hollow portion 247 by water vapor caused when heated may be suppressed. Therefore, separation of the protective member 244 may be prevented.

Further, even when the vent gap is formed, the porous layer 245c exists between the hollow portion 247 and the outside, and thus, the porous layer 245c functions as a filter and entry of foreign matters from the outside into the hollow portion 247 may be suppressed.

On the other hand, at ordinary temperature, due to contraction of the first wall member 245, the vent gap closes and the hollow portion 247 is insulated from the outside, and thus, entry of air containing water vapor of the outside through the porous layer 245c into the hollow portion 247 may be suppressed.

In this way, at ordinary temperature, the airtightness of the hollow portion 247 may be maintained, thereby preventing entry of foreign matters into the hollow portion 247. Further, when heated, vapor pressure in the hollow portion 247 may be relieved.

Note that, in the ninth embodiment, the one wall member is the first wall member 245 and the other wall member is the second wall member 246, but the present invention is not limited thereto. The one wall member may be the second wall member 246 and the other wall member may be the first wall member 245. More specifically, the outer wall member 246 may be a wall member including a porous layer. In this case, also, the effect and action similar to those of the above-mentioned ninth embodiment are obtained.

Further, in the ninth embodiment, in order that the one end 246a of the second wall member 246 is in contact with the protective member 244 at ordinary temperature, the other end 246b is fixed to the frame 242, but the present invention is not limited thereto. Alternatively, in order that the one end 246a of the second wall member 246 is in contact with the frame 242 at ordinary temperature, the other end 246b may be fixed to the protective member 244. In this case, an end of the first wall member 245 on a side to be fixed to the frame 242 is the one end, and an end of the first wall member 245 on a side to be fixed to the protective member 244 is the other end. In this case, also, the effect and action similar to those of the above-mentioned ninth embodiment are obtained.

Further, in the above description, the first wall member 245 as the one wall member has a three-layer structure, but the present invention is not limited thereto. In the case where the porous layer is formed so that both ends of the porous layer are bonded and fixed to the frame 242 and the protective member 244, respectively, one layer of the porous layer may form the one wall member.

Tenth Embodiment

Figure 10:
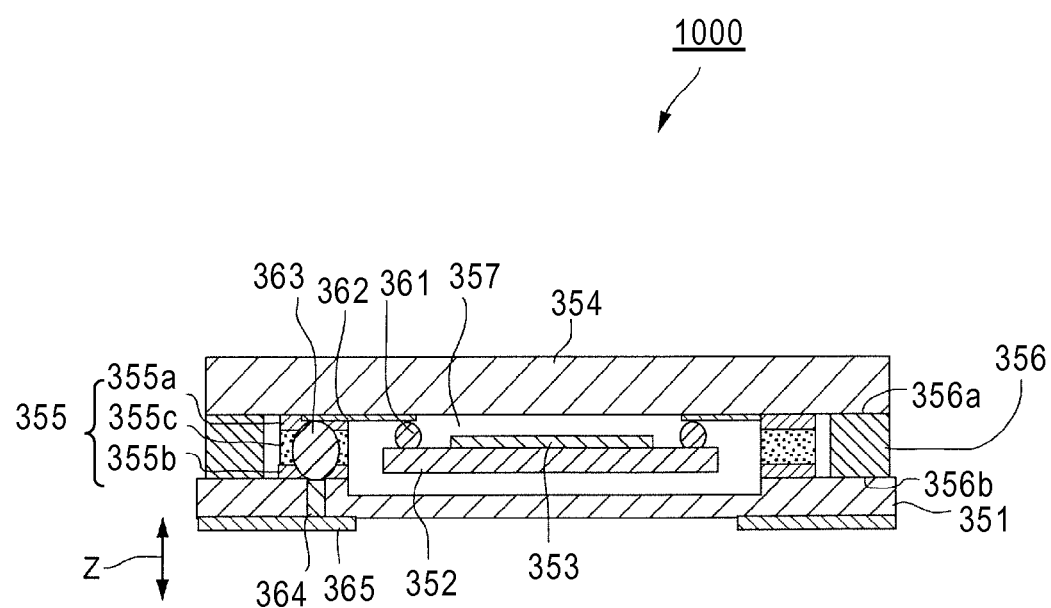
FIG. 10 is a sectional view illustrating a schematic structure of a semiconductor device according to a tenth embodiment of the present invention.

Next, a semiconductor device according to a tenth embodiment of the present invention is described. FIG. 10 is a sectional view of the semiconductor device according to the tenth embodiment in a state at ordinary temperature.

As illustrated in FIG. 10, a semiconductor device 1000 includes a wiring substrate 351, a protective member 354 spaced from the wiring substrate 351, and a semiconductor element 353 placed between the wiring substrate 351 and the protective member 354 and electrically connected to the wiring substrate 351. The semiconductor element 353 is an optical element having a function of any one of a light receiving portion and a light emitting portion or both thereof. Further, the protective member 354 has light permeability.

The semiconductor element 353 is displaced on a semiconductor substrate 352. The semiconductor element 353 and the wiring substrate 352 form a semiconductor chip. The protective member 354 has a wiring layer 362 provided thereon. The wiring substrate 352 is face-down mounted on the protective member 354. The wiring substrate 352 and the wiring layer 362 are electrically connected to each other through a bump 361. The wiring layer 362 and a wiring layer 365 of the wiring substrate 351 are electrically connected to each other through a bump 363 and a via hole 364. This electrically connects the semiconductor element 353 to the wiring substrate 351. In this way, when the semiconductor element 353 which is an optical element is face-down mounted on the protective member 354, also, the contour of the semiconductor device 1000 may be made smaller.

Further, the semiconductor device 1000 includes a first wall member 355 which is placed between the wiring substrate 351 and the protective member 354 so as to surround the semiconductor element 353 and which thermally expands in the height direction (direction of the arrow Z) when heated. Further, the semiconductor device 1000 includes a second wall member 356 which is placed between the wiring substrate 351 and the protective member 354 so as to surround the first wall member 355 and which thermally expands in the height direction when heated. In other words, the second wall member 356 is placed on the outer peripheral side of the first wall member 355. The first wall member 355 and the second wall member 356 are formed in the shape of a frame.

One of the first wall member 355 and the second wall member 356 (in FIG. 10, the first wall member 355) includes a breathable porous layer 355c. More specifically, for the purpose of fixing both ends of the porous layer 355c in the height direction to the wiring substrate 351 and the protective member 354, respectively, the first wall member 355 has a bonding layer 355a which forms one end in the height direction and a bonding layer 355b which forms the other end in the height direction. In other words, one end of the first wall member 355 in the height direction is formed of the bonding layer 355a and the other end of the first wall member 355 in the height direction is formed of the bonding layer 355b. In this way, the first wall member 355 includes three layers which are the bonding layers 355a and 355b and the breathable porous layer 355c sandwiched therebetween.

In the tenth embodiment, the bonding layer 355a of the first wall member 355 is bonded and fixed to one of the wiring substrate 351 and the protective member 354 (in FIG. 10, the protective member 354), and the bonding layer 355b of the first wall member 355 in the height direction is bonded and fixed to the other of the wiring substrate 351 and the protective member 354 (in FIG. 10, the wiring substrate 351).

On the other hand, the other of the first wall member 355 and the second wall member 356 (in the tenth embodiment, the second wall member 356) is formed of a material having a linear expansion coefficient which is smaller than that of the first wall member 355.

One end 356a of the second wall member 356 in the height direction is in contact with the protective member 354 out of the wiring substrate 351 and the protective member 354 at ordinary temperature. Further, the other end 356b of the second wall member 356 in the height direction is fixed to the wiring substrate 351 out of the wiring substrate 351 and the protective member 354.

The semiconductor substrate 352 is placed in a hollow portion formed with the first wiring substrate 351, the protective member 354, and the first wall member 355 being a bottom surface, a top surface, and side surfaces thereof, respectively. The semiconductor element 353 is mounted on a surface of the semiconductor substrate 352 on the protective member 354 side. A hollow portion 357 is formed by being surrounded by the wiring substrate 351, the protective member 354, and the first wall member 355. In other words, the semiconductor element 353 is placed in the hollow portion 357. Ordinary temperature as used herein includes heat generation temperature when the semiconductor element 353 operates (about 70° C.). Therefore, even when the temperature of air in the hollow portion 357 rises by the operation of the semiconductor element 353, the one end 356a of the second wall member 356 and the protective member 354 maintain the contact state.

The second wall member 356 has a linear expansion coefficient which is smaller than that of the first wall member 355, and thus, during heating in reflow mounting or the like on a motherboard, the amount of expansion of the second wall member 356 is smaller than that of the first wall member 355. Conversely, the first wall member 355 has a linear expansion coefficient which is larger than that of the second wall member 356, and thus, during heating, the amount of expansion of the first wall member 355 is larger than that of the second wall member 356. Therefore, a vent gap is formed between the protective member 354, which is pushed up by the first wall member 355, and the second wall member 356. This releases water vapor in the hollow portion 357 through the porous layer 355c and the vent gap to the outside, and pressure rise in the hollow portion 357 by water vapor caused when heated may be suppressed. Therefore, separation of the protective member 354 may be prevented.

Further, even when the vent gap is formed, the porous layer 355c exists between the hollow portion 357 and the outside, and thus, the porous layer 355c functions as a filter and entry of foreign matters from the outside into the hollow portion 357 may be suppressed.

On the other hand, at ordinary temperature, due to contraction of the first wall member 355, the vent gap closes and the hollow portion 357 is insulated from the outside, and thus, entry of air containing water vapor of the outside through the porous layer 355c into the hollow portion 357 may be suppressed.

In this way, at ordinary temperature, the airtightness of the hollow portion 357 may be maintained, thereby preventing entry of foreign matters into the hollow portion 357. Further, when heated, vapor pressure in the hollow portion 357 may be relieved.

Note that, in the tenth embodiment, the one wall member is the first wall member 355 and the other wall member is the second wall member 356, but the present invention is not limited thereto. The one wall member may be the second wall member 356 and the other wall member may be the first wall member 355. More specifically, the outer wall member 356 may be a wall member including a porous layer. In this case, also, the effect and action similar to those of the above-mentioned tenth embodiment are obtained.

Further, in the tenth embodiment, in order that the one end 356a of the second wall member 356 is in contact with the protective member 354 at ordinary temperature, the other end 356b is fixed to the wiring substrate 351, but the present invention is not limited thereto. Alternatively, in order that the one end of the second wall member 356 is in contact with the wiring substrate 351 at ordinary temperature, the other end may be fixed to the protective member 354. In this case, an end of the first wall member 355 on a side to be fixed to the wiring substrate 351 is the one end, and an end of the first wall member 355 on a side to be fixed to the protective member 354 is the other end. In this case, also, the effect and action similar to those of the above-mentioned tenth embodiment are obtained.

Figure 11A:
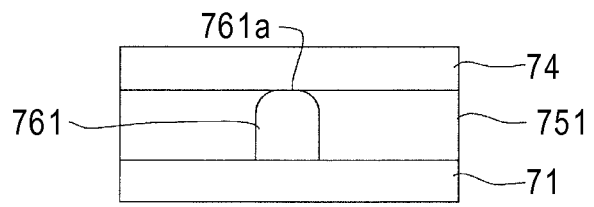
FIGS. 11A, 11B, 11C, and 11D are side views illustrating modified examples of a vent hole and a pillar member of the semiconductor device.
Figure 11B:
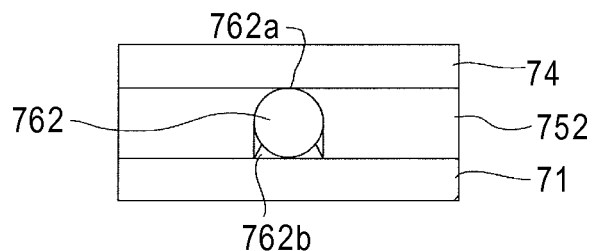
Figure 11C:
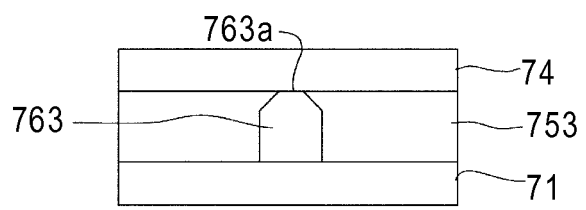

In the above-mentioned first to tenth embodiments, the vent hole which is a through hole is formed in the shape of a rectangle and the pillar member is formed in a shape so as to close the vent hole, but the shapes of the vent hole and the pillar member are not limited thereto. FIGS. 11A to 11D are side views of semiconductor devices illustrating modified examples of the vent hole and the pillar member of the semiconductor device. FIG. 11A illustrates a case in which one end of the pillar member is formed in the shape of a curved surface. FIG. 11B illustrates a case in which one end of the pillar member is formed in the shape of a segment of a circle. FIG. 11C illustrates a case in which one end of the pillar member is formed so as to be tapered. Note that, in any of these cases, a state at ordinary temperature is illustrated.

With regard to the method of bonding a protective member 74, for example, a thermosetting epoxy resin sheet may be used as the wall member and the protective member 74 may be thermocompression bonded to a wiring substrate 71. On that occasion, as illustrated in FIG. 11A, when one end 761a of a pillar member 761 is formed in the shape of a curved surface, the resin of a wall member 751 may be more easily pushed aside, and a non-bonded portion may be formed with more stability. Further, as illustrated in FIG. 11B, when a pillar member 762 is formed in the shape of a cylinder and the pillar member 762 is bonded to the wiring substrate 71 with an adhesive 762b, the resin of a wall member 752 may be more easily pushed aside because one end 762a of the pillar member 762 is in the shape of a segment of a circle. Therefore, a non-bonded portion may be formed with more stability. Further, as illustrated in FIG. 11C, when one end 763a of a pillar member 763 is formed so as to be tapered, the resin of a wall member 753 may be more easily pushed aside, and a non-bonded portion may be formed with more stability. In any of these cases, the one end 761a, 762a, or 763a of the pillar member 761, 762, or 763 in the height direction is formed so as to be tapered, and thus, the one end of the pillar member and the protective member may be brought into a non-bonded state with stability. Further, by plastic deformation of the pillar member with pressure when the protective member 74 is bonded, also, the resin of the wall member may be pushed aside to form the non-bonded portion with stability.

Figure 11D:
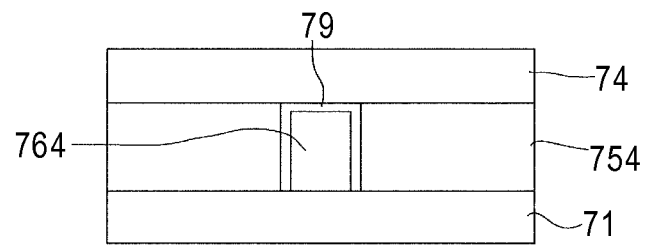

Next, FIG. 11D illustrates a case in which a coating layer is provided between the wall member and the pillar member. With regard to the method of bonding the protective member 74, for example, a thermosetting or photocurable liquid epoxy resin may be used as a wall member 754, and, after the wall member 754 is applied to the wiring substrate 71, the protective member 74 may be mounted and thermal cure may be carried out. On that occasion, as illustrated in FIG. 11D, on a pillar member 764, a coating layer 79, such as a fluororesin having low adhesion to the wall member 754 may be provided. In this case, bonding between the wall member 754 and the pillar member 764 may be suppressed and a non-bonded portion may be formed with more stability. Further, it is enough that the coating layer 79 is formed on a surface of the pillar member 764 where one end thereof is formed, and it is not necessarily required to form the coating layer 79 on the entire surface of the pillar member 764. Further, a similar effect may be obtained when a coating layer is provided on the one end of the pillar member 764 and on a surface on the protective member 74 side. Further, a coating layer 79 such as Al having low wettability with respect to the wall member 754 may be provided. In this case, the coating layer 79 may suppress spread of the wall member 754 on the pillar member 764 due to wettability, and thus, a non-bonded portion may be formed with stability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-123178, filed Jun. 1, 2011, and No.

2011-123179, filed Jun. 1, 2011 which are hereby incorporated by reference herein in their entirety.

The invention claimed is:

1. A semiconductor device, comprising:
    a wiring substrate having a semiconductor element mounted thereon;
    a protective member which is spaced from said wiring substrate and which has light permeability; and
    a wall member for joining said wiring substrate and said protective member together,
    wherein said semiconductor element is placed in a hollow portion, said hollow portion being formed with said wiring substrate, said protective member, and said wall member being a bottom surface, a top surface, and side surfaces thereof, respectively, and
    wherein said wall member has a vent hole formed therein, said vent hole being a through hole via which said hollow portion is in communication with the outside of the semiconductor device, and said vent hole includes a pillar member which is formed of a material having a linear expansion coefficient that is smaller than a linear expansion coefficient of said wall member, said pillar member being fixed to only one of said wiring substrate and said protective member, such that said vent hole is closed at ordinary temperature with said pillar member and is open at more than 100° C.

2. The semiconductor device according to claim 1, wherein said wall member joins said protective member and said wiring substrate together through a frame, and said pillar member is fixed to only one of said wiring substrate and said frame, or only one of said protective member and said frame.

3. The semiconductor device according to claim 1, wherein said pillar member has a tapered shape on one of the bottom surface side and the top surface side.

* * * * *